US012278239B2

(12) United States Patent
Tanaka

(10) Patent No.: US 12,278,239 B2
(45) Date of Patent: Apr. 15, 2025

(54) SEMICONDUCTOR INTEGRATED CIRCUIT

(71) Applicant: Sony Semiconductor Solutions Corporation, Kanagawa (JP)

(72) Inventor: Yoshinori Tanaka, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 113 days.

(21) Appl. No.: 16/644,395

(22) PCT Filed: Jul. 6, 2018

(86) PCT No.: PCT/JP2018/025628
§ 371 (c)(1),
(2) Date: Mar. 4, 2020

(87) PCT Pub. No.: WO2019/049498
PCT Pub. Date: Mar. 14, 2019

(65) Prior Publication Data
US 2021/0074728 A1    Mar. 11, 2021

(30) Foreign Application Priority Data

Sep. 11, 2017  (JP) .................................. 2017-173808

(51) Int. Cl.
*H01L 27/11*    (2006.01)
*H01L 27/118*   (2006.01)
*H03K 3/037*    (2006.01)

(52) U.S. Cl.
CPC ...... *H01L 27/11807* (2013.01); *H03K 3/0372* (2013.01); *H01L 2027/11875* (2013.01); *H01L 2027/11881* (2013.01)

(58) Field of Classification Search
CPC .... H03K 3/012; H03K 3/0372; H03K 3/0375; H03K 3/35625; H03K 3/289
(Continued)

(56) References Cited

U.S. PATENT DOCUMENTS 5,164,612 A     11/1992  Kaplinsky
8,723,574 B2 *   5/2014  Tomita ................ H01L 27/0207
                                                         327/202
(Continued)

FOREIGN PATENT DOCUMENTS

CN     105306050 A    2/2016
CN     106533395 A    3/2017
(Continued)

*Primary Examiner* — Quan Tra
(74) *Attorney, Agent, or Firm* — Michael Best & Friedrich LLP

(57) ABSTRACT

In a semiconductor integrated circuit in which a pair of signal lines is wired, the wiring shape of these signal lines is simplified.
An output circuit outputs a predetermined differential signal from a positive output terminal and a negative output terminal. A plurality of positive transistors and a plurality of negative transistors are disposed in a logic circuit. Gates of the plurality of positive transistors are arranged in a predetermined direction. Gates of the plurality of negative transistors are arranged in a predetermined direction. A positive signal line is wired from the positive output terminal along the predetermined direction, and connects each of the gates of the plurality of positive transistors and the positive output terminal. A negative signal line is wired from the negative output terminal along the predetermined direction, and connects each of the gates of the plurality of negative transistors and the negative output terminal.

11 Claims, 31 Drawing Sheets

(58) Field of Classification Search
USPC .............................. 327/202, 203, 208, 218
See application file for complete search history.

(56) References Cited

U.S. PATENT DOCUMENTS

| | | | | |
|---|---|---|---|---|
| 9,641,161 | B1* | 5/2017 | Liu | H01L 27/092 |
| 2009/0167394 | A1* | 7/2009 | Bosshart | H03K 3/35625 |
| | | | | 327/203 |
| 2011/0032016 | A1* | 2/2011 | Maeno | H03K 3/356156 |
| | | | | 327/203 |
| 2012/0286837 | A1* | 11/2012 | Tomita | H01L 27/092 |
| | | | | 327/203 |
| 2017/0077910 | A1* | 3/2017 | Kim | G01R 31/318541 |
| 2017/0292993 | A1* | 10/2017 | Yoon | G01R 31/31725 |
| 2017/0292995 | A1* | 10/2017 | Semenov | G01R 31/31701 |
| 2017/0359054 | A1* | 12/2017 | Hsu | H03K 19/0002 |
| 2018/0301447 | A1* | 10/2018 | Zhu | H01L 27/0207 |

FOREIGN PATENT DOCUMENTS

| | | |
|---|---|---|
| JP | 63-152145 A | 6/1988 |
| JP | 04-276382 A | 10/1992 |
| JP | 05-082644 A | 4/1993 |
| JP | 05-226618 A | 9/1993 |
| JP | 05-267626 A | 10/1993 |
| JP | 06-021225 A | 1/1994 |
| JP | 2003-347404 A | 12/2003 |
| JP | 2006047039 A | 2/2006 |
| JP | 2007329324 A | 12/2007 |
| JP | 2010-262572 A | 11/2010 |
| JP | 2012-238744 A | 12/2012 |
| JP | 2013-175633 A | 9/2013 |

* cited by examiner

SEMICONDUCTOR INTEGRATED CIRCUIT

TECHNICAL FIELD

The present technology relates to a semiconductor integrated circuit. Specifically, the present technology relates to a semiconductor integrated circuit that operates by a differential signal.

BACKGROUND ART

In a semiconductor integrated circuit, a synchronous circuit that operates in synchronization with a differential signal including a clock signal and an inverted clock signal has been traditionally used. For example, a semiconductor integrated circuit in which a master latch and a slave latch are arranged in a predetermined direction has been proposed. The master latch and the slave latch operate in synchronization with a differential signal (see, for example, Patent Document 1). In this semiconductor integrated circuit, gates of a plurality of transistors are arranged in a line in a direction different from the latch arrangement direction in the master latch and the slave latch.

CITATION LIST

Patent Document

Patent Document 1: Japanese Patent Application Laid-Open No. 2013-175633

SUMMARY OF THE INVENTION

Problems to be Solved by the Invention

Since gates of a plurality of transistors are arranged in a line in the above-described traditional art, a pair of clock signal lines for supplying a differential signal to the gates can be linearly wired along the line. Differential signals, however, need to be distributed to both of a master latch and a slave latch arranged in a predetermined direction different from a gate arrangement direction. For this reason, the clock signal lines wired in the gate arrangement direction need to be bent or divided in a predetermined direction different from the direction. Unfortunately, the wiring shape of the clock signal lines is complicated. A complicated wiring shape causes harmful effects such as increases in parasitic capacitance and manufacturing variation. Consequently, a signal line desirably has a simple wiring shape.

The present technology has been established in view of such a situation, and an object thereof is to simplify the wiring shape of the signal lines in a semiconductor integrated circuit in which a pair of signal lines is wired.

Solutions to Problems

The present technology is made to solve the above-described problems, and a first aspect of thereof is a semiconductor integrated circuit including: an output circuit that outputs a predetermined differential signal from a positive output terminal and a negative output terminal; a logic circuit in which a plurality of positive transistors and a plurality of negative transistors are disposed, gates of the plurality of positive transistors being arranged in a predetermined direction, gates of the plurality of negative transistors being arranged in the predetermined direction; a positive signal line that is wired from the positive output terminal along the predetermined direction and that connects each of the gates of the plurality of positive transistors and the positive output terminal; and a negative signal line that is wired from the negative output terminal along the predetermined direction and that connects each of the gates of the plurality of negative transistors and the negative output terminal. This makes an effect of the positive signal line and the negative signal line being wired along the predetermined direction.

Furthermore, in the first aspect, the differential signal may include a clock signal and a signal obtained by inverting the clock signal, the output circuit may include an inverter that inverts the clock signal, and the logic circuit may include: a master latch that holds and outputs data in synchronization with the differential signal; and a slave latch that holds the output data in synchronization with the differential signal. This makes an effect of data being held in the master latch and the slave latch in synchronization with a differential signal.

Furthermore, in the first aspect, the master latch and the slave latch may be arranged in the predetermined direction. This makes an effect of the positive signal line and the negative signal line being wired along the predetermined direction in the master latch and the slave latch arranged in the predetermined direction.

Furthermore, in the first aspect, the master latch and the slave latch may be arranged in a direction perpendicular to the predetermined direction. This makes an effect of the positive signal line and the negative signal line being wired along the predetermined direction in the master latch and the slave latch arranged in a direction perpendicular to the predetermined direction.

Furthermore, in the first aspect, a power line and a ground line may be wired along a direction perpendicular to the predetermined direction, and the power line and the ground line may be alternately wired in the predetermined direction. This makes an effect of power being supplied via the power line and the ground line wired in a direction perpendicular to the predetermined direction.

Furthermore, in the first aspect, the differential signal may include a selection signal and a signal obtained by inverting the selection signal, the output circuit may include an inverter that inverts the selection signal, and the logic circuit may include a multiplexer that selects one of a plurality of pieces of data in accordance with the differential signal. This makes an effect of one of a plurality of pieces of data being selected in accordance with the differential signal.

Furthermore, in the first aspect, the differential signal may include a selection signal and a signal obtained by inverting the selection signal, the output circuit may include a first multiplexer that selects one of a plurality of pieces of data in accordance with the differential signal, and the logic circuit may include a second multiplexer that selects one of a plurality of pieces of data in accordance with the differential signal. This makes an effect of an inverter being reduced.

Furthermore, in the first aspect, the differential signal may include a first differential signal and a second differential signal, the logic circuit may include a first circuit and a second circuit arranged in the predetermined direction, and the output circuit may include: a first inverter that generates the first differential signal and outputs the generated first differential signal to the first circuit; and a second inverter that generates the second differential signal and outputs the generated second differential signal to the second circuit. This makes an effect of a plurality of differential signals being output by a plurality of inverters.

Furthermore, in the first aspect, the output circuit and the logic circuit may have different sizes in the predetermined direction. This makes an effect of the positive signal line and the negative signal line being wired along the predetermined direction in the output circuit and the logic circuit having different sizes.

Furthermore, in the first aspect, the logic circuit may include a plurality of circuits arranged in a two-dimensional lattice pattern. This makes an effect of the positive signal line and the negative signal line being wired along the predetermined direction in the plurality of circuits arranged in the two-dimensional lattice pattern.

Furthermore, in the first aspect, the positive signal line and the negative signal line may be bent in a direction perpendicular to the predetermined direction in the output circuit. This makes an effect of the positive signal line and the negative signal line bent in the predetermined direction being wired.

Effects of the Invention

According to the present technology, an excellent effect of the wiring shape of a pair of signal lines being simplified in a semiconductor integrated circuit, in which the pair of signal lines is wired, can be exhibited. Note that the effect described here is not necessarily limited, and either of the effects described in the present disclosure may be exhibited.

MODE FOR CARRYING OUT THE INVENTION

Embodiments for carrying out the present technology (hereinafter referred to as embodiments) will be described below. The description will be given in the following order.

1. First Embodiment (Example of Signal Line Wired in Circuit Arrangement Direction)
2. Second Embodiment (Example of Signal Line Wired in Latch Arrangement Direction)
3. Third Embodiment (Example of Signal Line Wired in Multiplexer Arrangement Direction)
4. Fourth Embodiment (Example of Signal Line Wired in Direction in Which Plurality of Circuits Having Different Heights Is Arranged)
5. Fifth Embodiment (Example of Signal Line Wired in Column Direction of Circuits Arranged in Two-dimensional Lattice Pattern)
6. Sixth Embodiment (Example of Signal Line Wired in Direction in Which Plurality of Inverters and Multiplexers Is Arranged)
7. Seventh Embodiment (Example in Which Signal Line Wired in Circuit Arrangement Direction is Bent in Direction Different from Circuit Arrangement Direction)
8. Eighth Embodiment (Example in Which Signal Line Is Wired in Inverter And Latch Arrangement Direction, And Plurality of Latches Are Arranged in Direction Different from Inverter And Latch Arrangement Direction)
9. Application Example 1. First Embodiment

[Configuration Example of Electronic Device]

Figure 1:
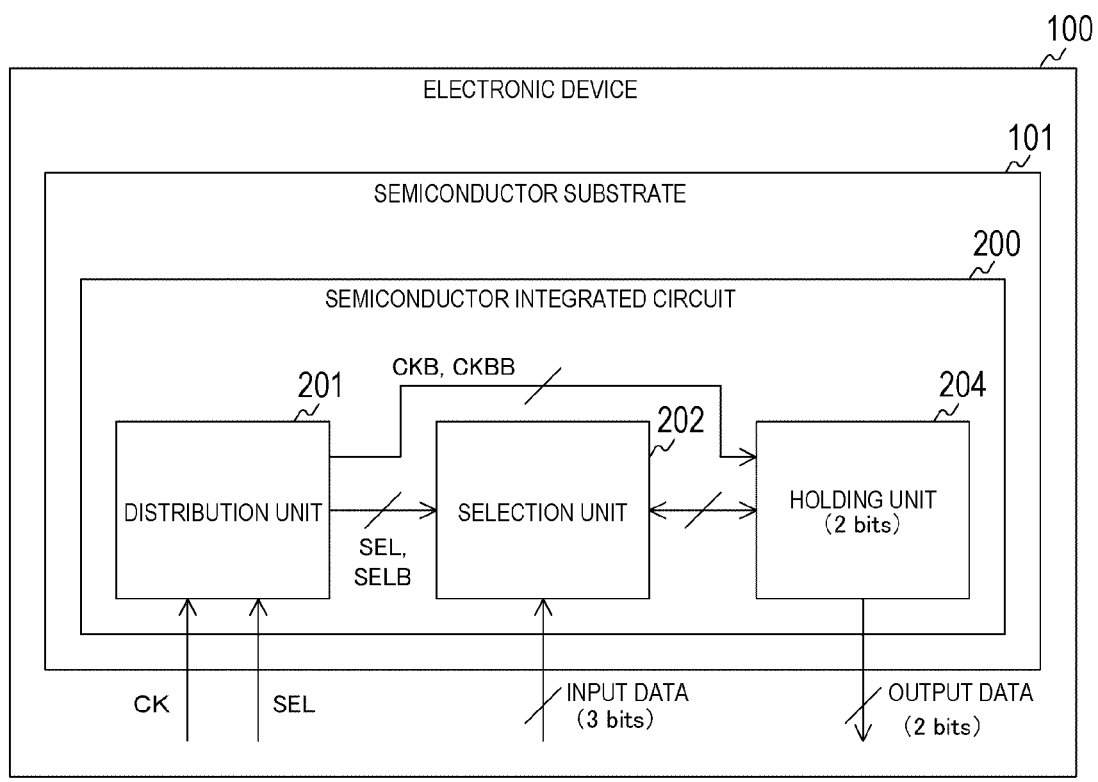
FIG. 1 is a block diagram illustrating one configuration example of an electronic device in a first embodiment of the present technology.

FIG. 1 is a block diagram illustrating one configuration example of an electronic device 100 in an embodiment of the present technology. The electronic device 100 includes a semiconductor substrate 101 provided with a semiconductor integrated circuit 200. Various instruments and devices, such as digital cameras and smartphones, are assumed as the electronic device 100. The semiconductor integrated circuit 200 includes a distribution unit 201, a selection unit 202, and a holding unit 204.

The distribution unit 201 distributes differential signals to circuits in the selection unit 202 and the holding unit 204. A clock signal CK and a selection signal SEL are input to the distribution unit 201. The distribution unit 201 inverts the clock signal CK to generate a clock signal CKB, and further inverts the clock signal CKB to generate a clock signal CKBB. Furthermore, the distribution unit 201 inverts the selection signal SEL to generate a selection signal SELB. Then, the distribution unit 201 supplies the differential signal including the selection signals SEL and SELB to the selection unit 202, and supplies the differential signal including the clock signals CKB and CKBB to the holding unit 204.

The selection unit 202 selects one of a plurality of pieces of data in accordance with the selection signals SEL and SELB. Input data of four bits is input to the selection unit 202, and one bit out of the four bits is input from the holding unit 204. Each piece of input data of one bit constituting four bits is defined as IN1, IN2, IN3, or IN4. The input data IN4 out of pieces of input data IN1, IN2, IN3, and IN4 is input from the holding unit 204.

The selection unit 202 selects one of pieces of input data IN1 and IN2 in accordance with the selection signals SEL and SELB, and outputs the selected input data to the holding unit 204 as output data Y1. Furthermore, the selection unit 202 selects one of pieces of input data IN3 and IN4 in accordance with the selection signals SEL and SELB, and outputs the selected input data as output data Y2 to the holding unit 204.

The holding unit 204 holds data of two bits in synchronization with the clock signals CKB and CKBB. The holding unit 204 holds the output data Y1 from the selection unit 202 in synchronization with the clock signals CKB and CKBB. Then, the holding unit 204 feeds back the held data as the input data IN4 to the selection unit 202, and outputs the held data as output data OUT1. Furthermore, the holding unit 204 holds the output data Y2 from the selection unit 202 in synchronization with the clock signals CKB and CKBB, and outputs the held data as output data OUT2.

[Configuration Example of Distribution Unit]

Figure 2:
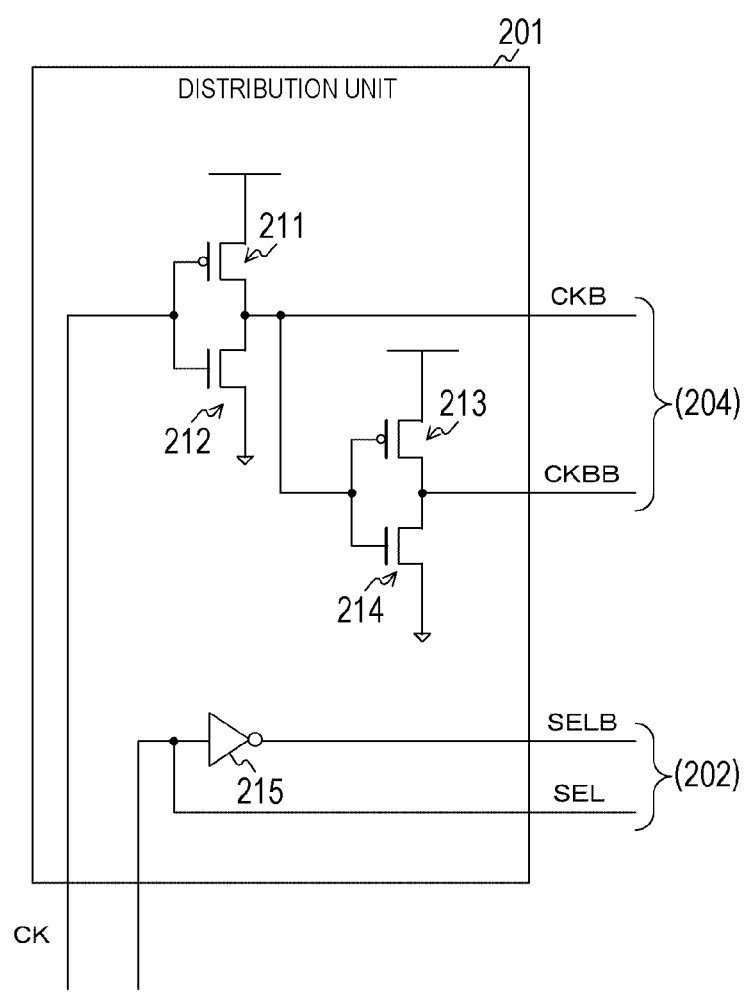
FIG. 2 is a circuit diagram illustrating one configuration example of a distribution unit in the first embodiment of the present technology.

FIG. 2 is a circuit diagram illustrating one configuration example of the distribution unit 201 in a first embodiment of the present technology. The distribution unit 201 includes P-type transistors 211 and 213, N-type transistors 212 and 214, and an inverter 215. The P-type transistors 211 and 213 and the N-type transistors 212 and 214 are, for example, metal-oxide-semiconductor (MOS) transistors.

The P-type transistor 211 and the N-type transistor 212 are connected in series between a power terminal and a ground terminal. The clock signal CK is input to the gates of the P-type transistor 211 and the N-type transistor 212. Furthermore, the connection point between the P-type transistor 211 and the N-type transistor 212 is connected to the holding unit 204 and the gates of the P-type transistor 213 and the N-type transistor 214. A signal from the connection point corresponds to the clock signal CKB.

The P-type transistor 213 and the N-type transistor 214 are connected in series between the power terminal and the ground terminal. The connection point of the P-type transistor 213 and the N-type transistor 214 is connected to the holding unit 204. A signal from the connection point corresponds to the clock signal CKBB.

The inverter 215 inverts the selection signal SEL to output the inverted selection signal SEL as a selection signal SELB to the selection unit 202.

[Configuration Example of Selection Unit]

Figure 3:
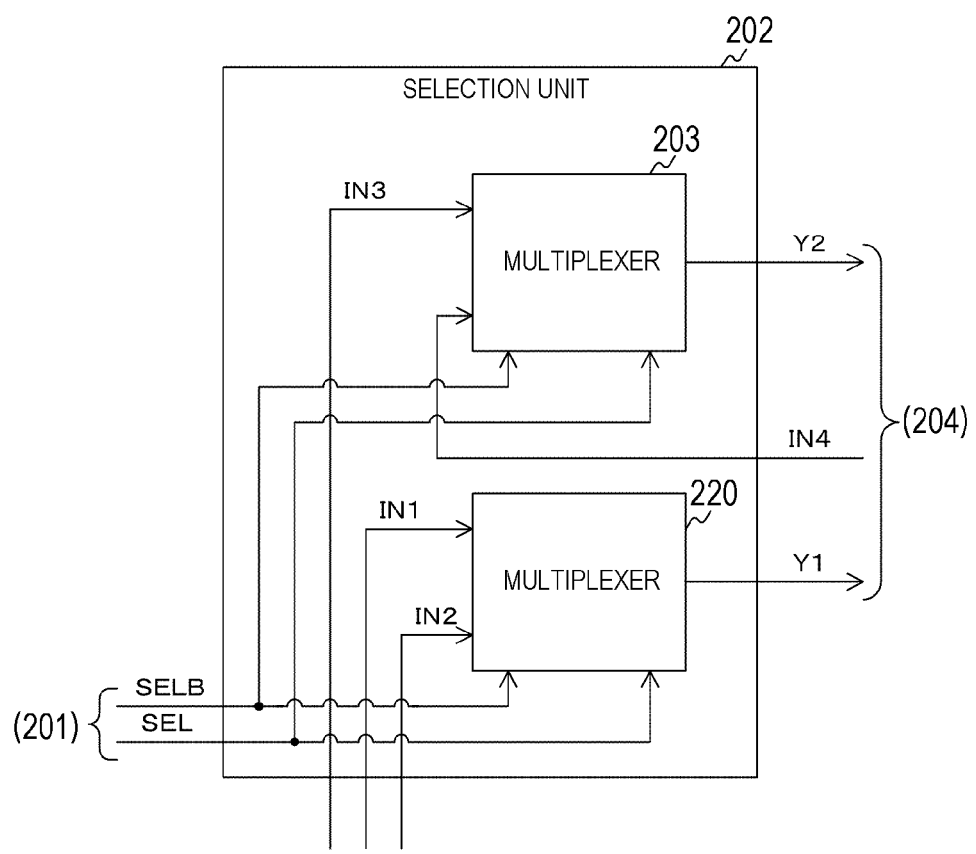
FIG. 3 is a block diagram illustrating one configuration example of a selection unit in the first embodiment of the present technology.

FIG. 3 is a block diagram illustrating one configuration example of the selection unit 202 in the first embodiment of the present technology. The selection unit 202 includes 2-input 1-output multiplexers 203 and 220.

The multiplexer 203 selects one of pieces of input data IN3 and IN4 in accordance with the selection signals SEL and SELB, and outputs the selected input data as output data Y2 to the holding unit 204. The multiplexer 220 selects one of pieces of input data IN1 and IN2 in accordance with the selection signals SEL and SELB, and outputs the selected input data as output data Y1 to the holding unit 204.

[Configuration Example of Multiplexer]

Figure 4:
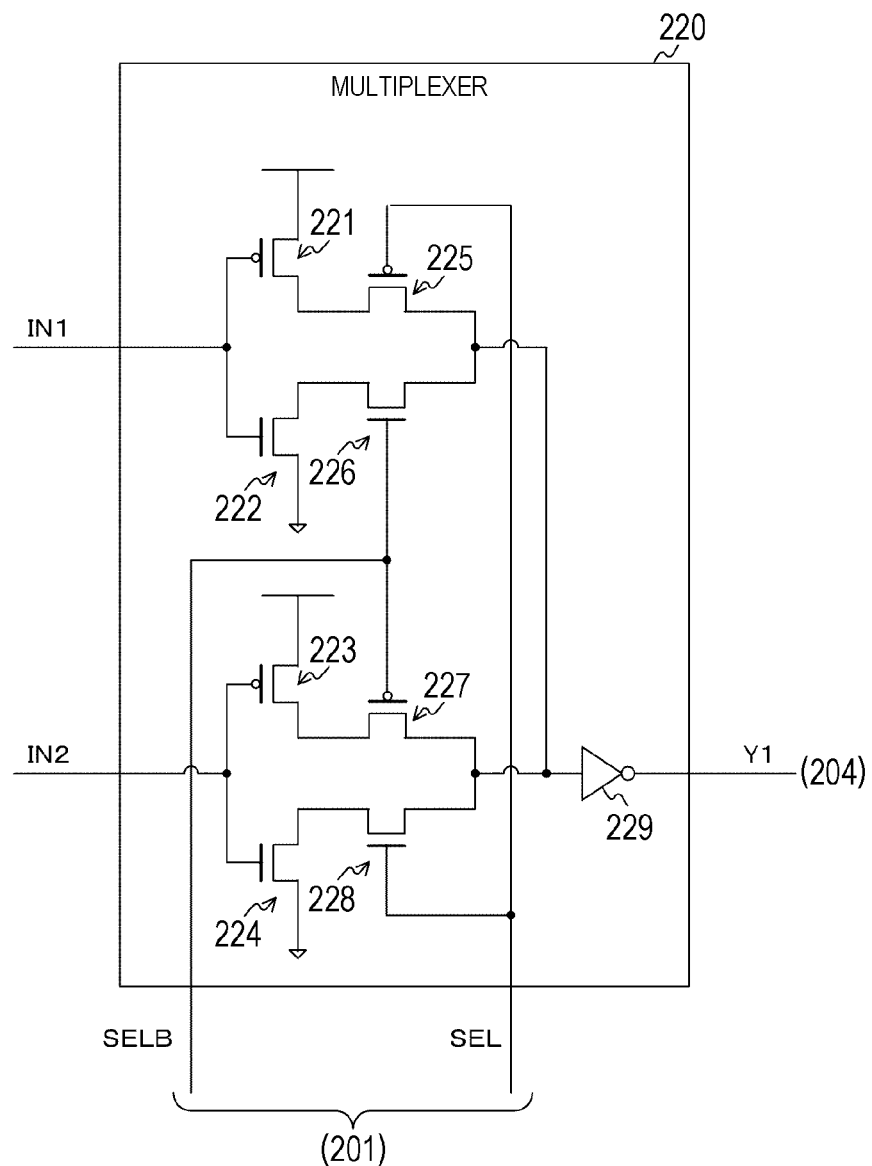
FIG. 4 is a circuit diagram illustrating one configuration example of a multiplexer in the first embodiment of the present technology.

FIG. 4 is a circuit diagram illustrating one configuration example of the multiplexer 220 in the first embodiment of the present technology. The multiplexer 220 includes P-type transistors 221, 223, 225 and 227, N-type transistors 222, 224, 226, and 228, and an inverter 229. The P-type transistors 221, 223, 225 and 227 and the N-type transistors 222, 224, 226, and 228 are, for example, MOS transistors.

The P-type transistors 221 and 225 and the N-type transistors 226 and 222 are connected in series between the power terminal and the ground terminal. The input data IN1 is input to the gates of the P-type transistor 221 and the N-type transistor 222. The selection signal SEL from the distribution unit 201 is input to a gate of the P-type transistor 225. The selection signal SELB from the distribution unit 201 is input to a gate of the N-type transistor 226. Furthermore, the connection point of the P-type transistor 225 and the N-type transistor 226 is connected to an input terminal of the inverter 229.

The P-type transistors 223 and 227 and the N-type transistors 228 and 224 are connected in series between the power terminal and the ground terminal. The input data IN2 is input to the gates of the P-type transistor 223 and the N-type transistor 224. The selection signal SELB from the distribution unit 201 is input to a gate of the P-type transistor 227. The selection signal SEL from the distribution unit 201 is input to a gate of the N-type transistor 228. Furthermore, the connection point of the P-type transistor 227 and the N-type transistor 228 is connected to the input terminal of the inverter 229.

The inverter 229 inverts data input to the input terminal. The inverter 229 outputs the inverted data as output data Y1 to the holding unit 204.

The above-described connection configuration causes the multiplexer 220 to select one of pieces of input data IN1 and IN2 in accordance with the selection signals SEL and SELB, and output the selected input data as output data Y1.

Note that the configuration of the multiplexer 203 is similar to that of the multiplexer 220.

[Configuration Example of Holding Unit]

Figure 5:
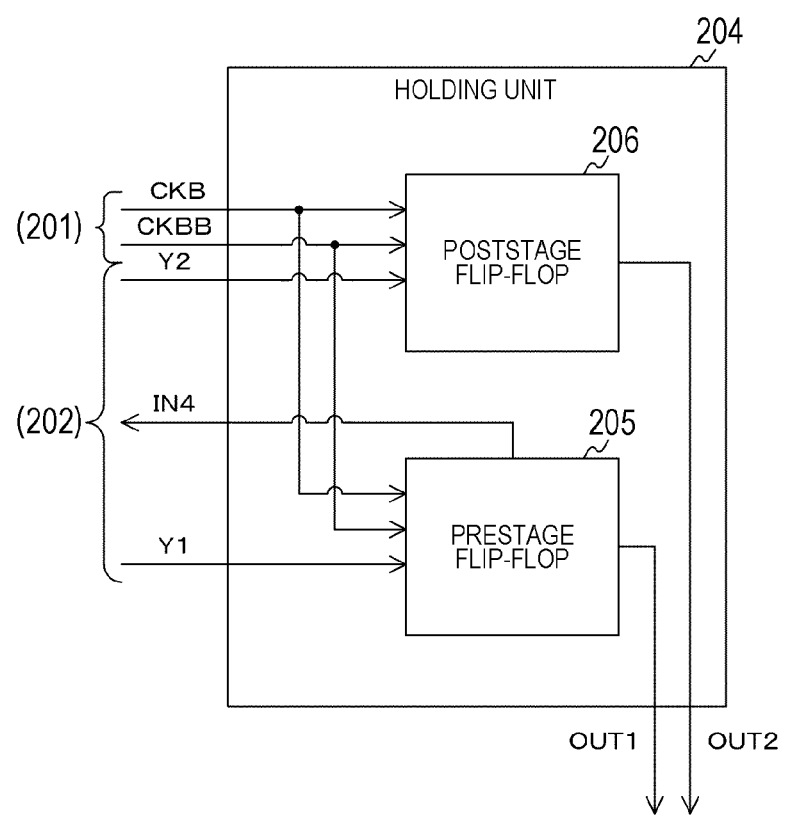
FIG. 5 is a block diagram illustrating one configuration example of a holding unit in the first embodiment of the present technology.

FIG. 5 is a block diagram illustrating one configuration example of the holding unit 204 in the first embodiment of the present technology. The holding unit 204 includes a prestage flip-flop 205 and a poststage flip-flop 206.

The prestage flip-flop 205 holds the output data Y1 from the selection unit 202 in synchronization with the clock signals CKB and CKBB. The prestage flip-flop 205 outputs the held data as output data OUT1, and feeds back the held data as the input data IN4 to the selection unit 202.

The poststage flip-flop 206 holds the output data Y2 from the selection unit 202 in synchronization with the clock signals CKB and CKBB. The poststage flip-flop 206 outputs the held data as output data OUT2.

[Configuration Example of Flip-Flop]

Figure 6:
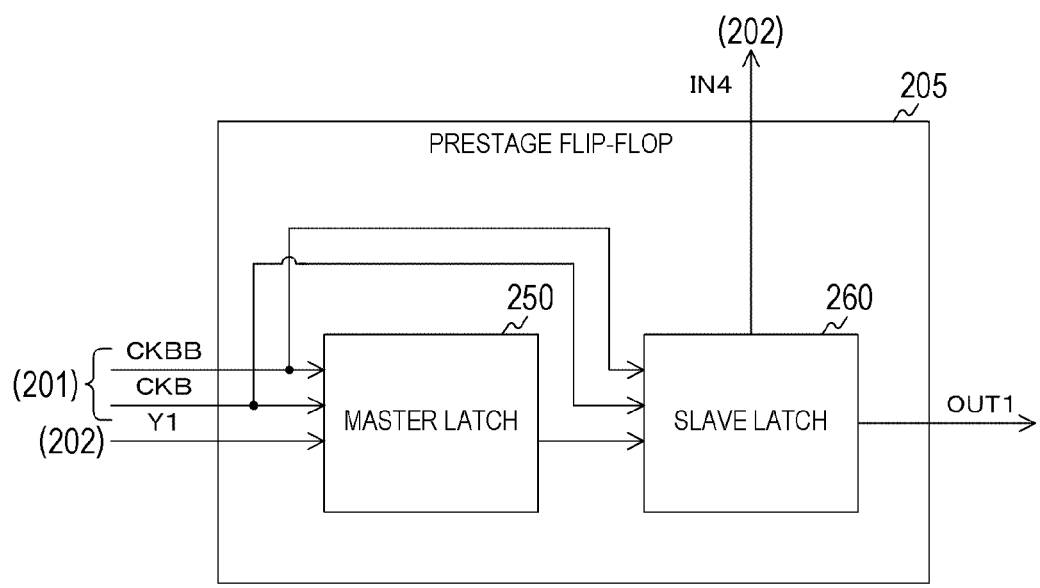
FIG. 6 is a block diagram illustrating one configuration example of a prestage flip-flop in the first embodiment of the present technology.

FIG. 6 is a block diagram illustrating one configuration example of the prestage flip-flop 205 in the first embodiment of the present technology. The prestage flip-flop 205 includes a master latch 250 and a slave latch 260.

The master latch 250 inverts and holds the output data Y1 from the selection unit 202 in synchronization with the clock signals CKB and CKBB. The master latch 250 outputs the held data to the slave latch 260.

The slave latch 260 holds data from the master latch 250 in synchronization with the clock signals CKB and CKBB. The slave latch 260 outputs the held data as output data OUT1, and feeds back the held data as input data IN4 to the selection unit 202.

Note that the configuration of the poststage flip-flop 206 is similar to that of the prestage flip-flop 205 except that the slave latch outputs no data to the selection unit 202.

[Configuration Example of Latch]

Figure 7:
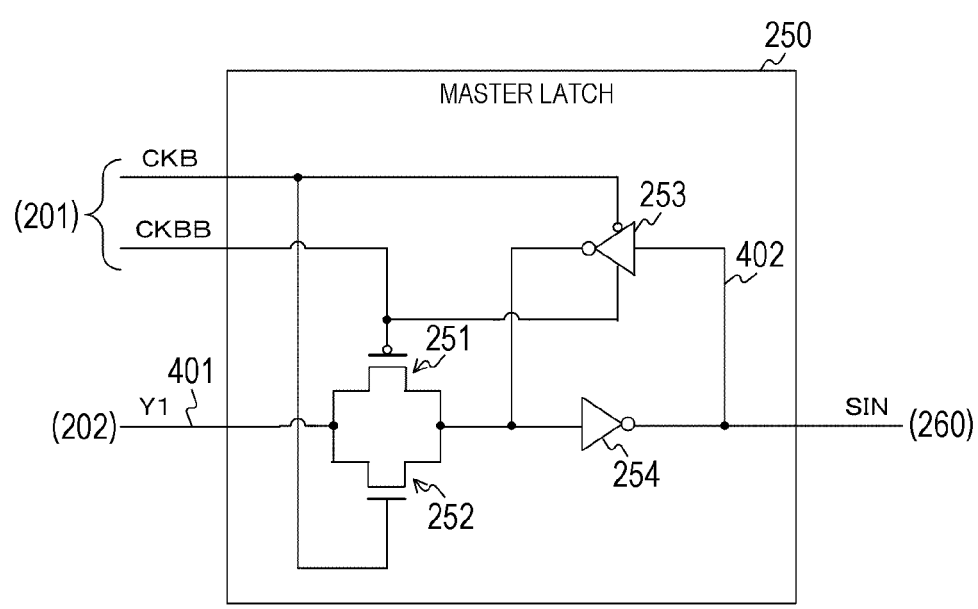
FIG. 7 is a circuit diagram illustrating one configuration example of a master latch in the first embodiment of the present technology.

FIG. 7 is a circuit diagram illustrating one configuration example of the master latch 250 in the first embodiment of the present technology. The master latch 250 includes a P-type transistor 251, an N-type transistor 252, a clocked inverter 253, and an inverter 254. The P-type transistor 251 and the N-type transistors 252 are, for example, MOS transistors.

The P-type transistor 251 and the N-type transistor are connected in parallel between the selection unit 202 and an input terminal of the inverter 254. Furthermore, the clock signal CKBB is input to a gate of the P-type transistor 251, and the clock signal CK is input to a gate of the N-type transistor 252. Furthermore, the P-type transistor 251 and the N-type transistor 252 are connected to the selection unit 202 via a data line 401.

The inverter 254 inverts input data Y1 from the P-type transistor 251 and the N-type transistor 252 or data fed back from the clocked inverter 253. The inverter 254 outputs the inverted data as input data SIN to the slave latch 260 and an input terminal of the clocked inverter 253.

The clocked inverter 253 inverts data from the inverter 254 in accordance with the clock signals CKB and CKBB, and feeds back the inverted data to the input terminal of the inverter 254. Furthermore, the inverter 254 is connected to clocked inverter 253 via a data line 402.

The above-described connection configuration causes the master latch 250 to invert, hold, and output the output data Y1 in synchronization with the clock signals CKB and CKBB.

Figure 8:
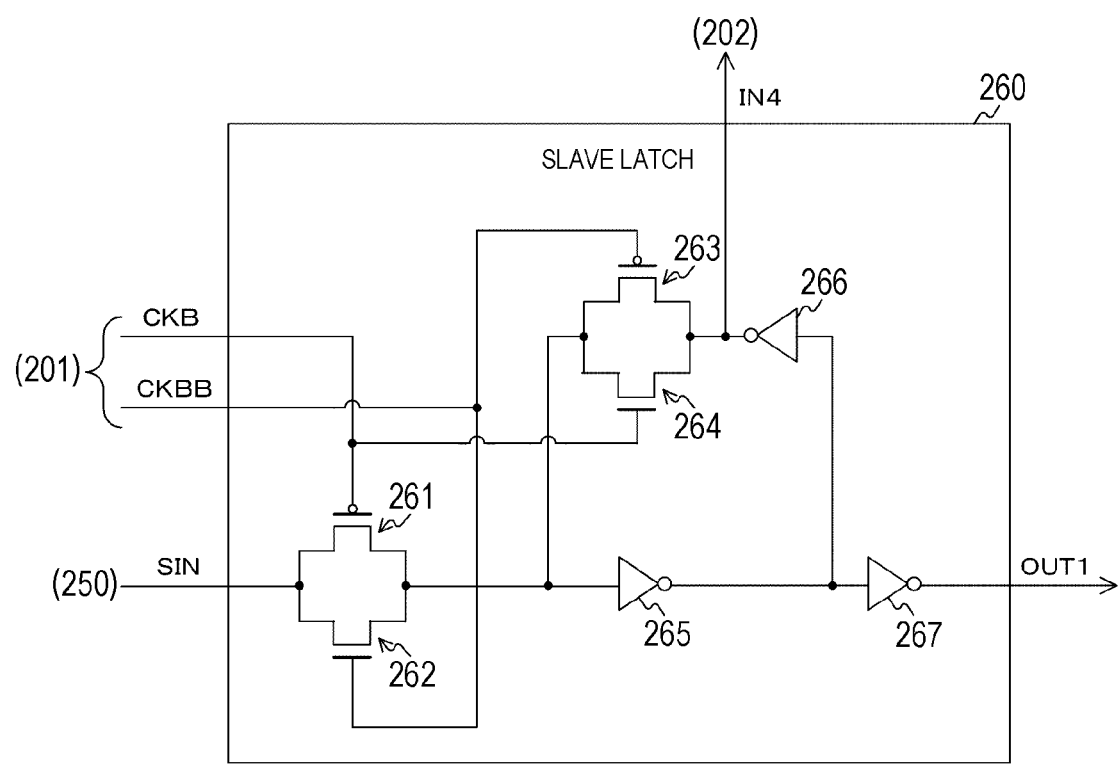
FIG. 8 is a circuit diagram illustrating one configuration example of a slave latch in the first embodiment of the present technology.

FIG. 8 is a circuit diagram illustrating one configuration example of the slave latch 260 in the first embodiment of the present technology. The slave latch 260 includes P-type transistors 261 and 263, N-type transistors 262 and 264, and inverters 265, 266 and 267. The P-type transistors 261 and 263 and the N-type transistors 262 and 264 are, for example, MOS transistors.

The P-type transistor 261 and the N-type transistor 262 are connected in parallel between the master latch 250 and an input terminal of the inverter 265. Furthermore, the clock signal CKB is input to a gate of the P-type transistor 261, and the clock signal CKBB is input to a gate of the N-type transistor 262.

The inverter 265 inverts input data SIN from the P-type transistor 261 and the N-type transistor 262 or data fed back from the P-type transistor 263 and the N-type transistor 264. The inverter 265 outputs the inverted data to the inverters 266 and 267.

The inverter 266 inverts data from the inverter 265, and feeds back the inverted data to the P-type transistor 263 and the N-type transistor 264. Furthermore, the inverter 266 also feeds back the inverted data as the input data IN4 to the selection unit 202.

The P-type transistor 263 and the N-type transistor 264 are connected in parallel between the inverter 266 and the inverter 265. Furthermore, the clock signal CKBB is input to a gate of the P-type transistor 263, and the clock signal CKB is input to a gate of the N-type transistor 264.

The inverter 267 inverts data from the inverter 265, and outputs the inverted data as the output data OUT1.

The above-described connection configuration causes the slave latch 260 to hold the input data SIN and output the input data SIN as the output data OUT1 in synchronization with the clock signals CKB and CKBB.

Figure 9:
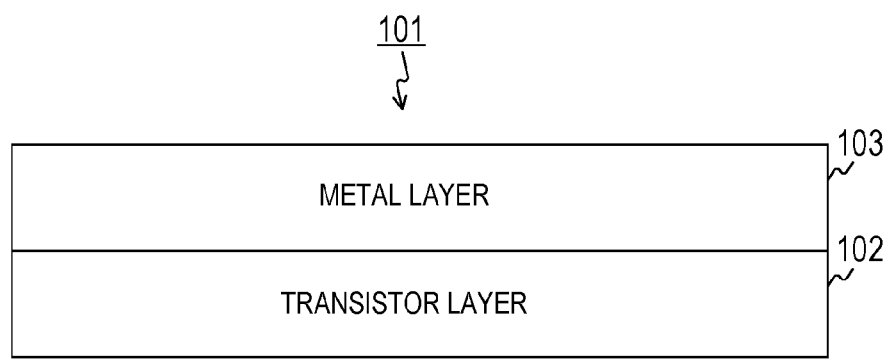
FIG. 9 illustrates the stacking structure of a semiconductor substrate in the first embodiment of the present technology.
Figure 9:
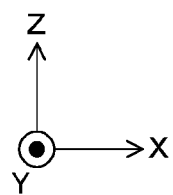

FIG. 9 illustrates the stacking structure of the semiconductor substrate 101 in the first embodiment of the present technology. The semiconductor substrate 101 includes a stacked transistor layer 102 and metal layer 103. Hereinafter, a predetermined direction parallel to the substrate plane of the semiconductor substrate 101 is defined as an X direction, and a direction perpendicular to the X direction is defined as a Y direction.

[Example of Wiring Layout]

Figure 10:
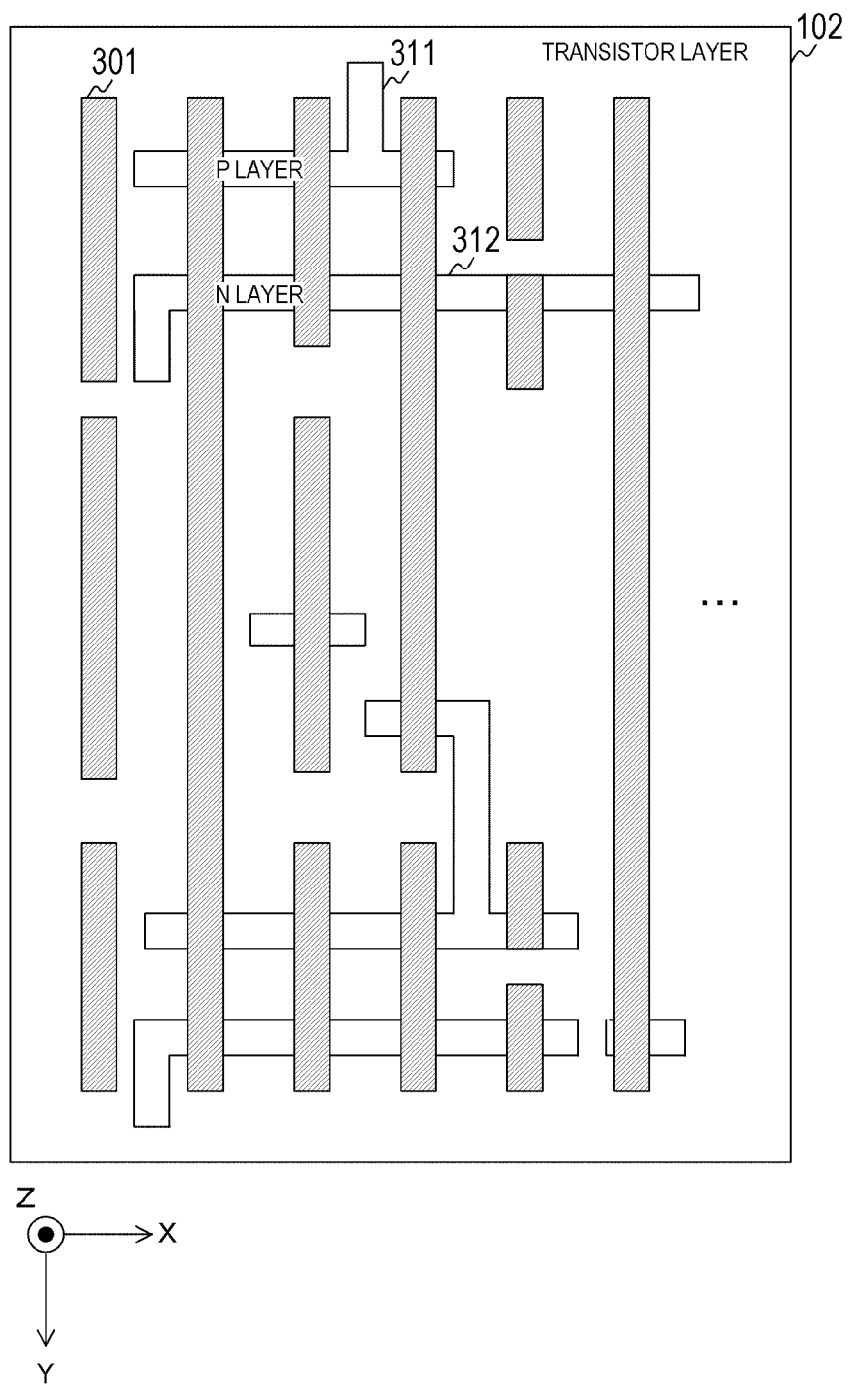
FIG. 10 is a plan view illustrating one example of a wiring layout of a transistor layer in the first embodiment of the present technology.

FIG. 10 is a plan view illustrating one example of a wiring layout of the transistor layer 102 in the first embodiment of the present technology. The transistor layer 102 includes a plurality of P layers such as a P layer 311 and a plurality of N layers such as an N layer 312 along the X direction. Furthermore, a plurality of clock signal lines such as a clock signal line 301 is wired in the Y direction.

Figure 11:
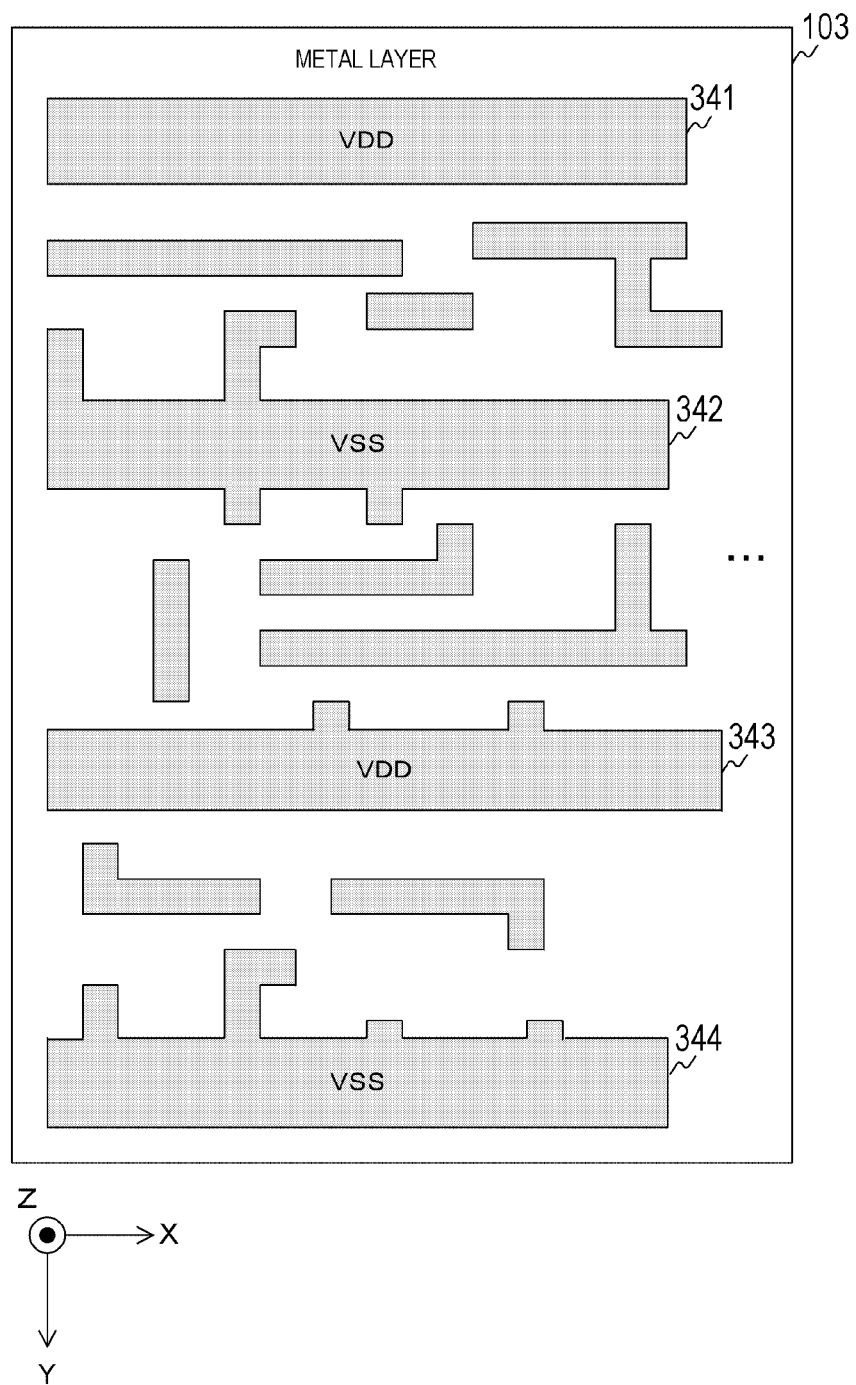
FIG. 11 is a plan view illustrating one example of a wiring layout of a metal layer in the first embodiment of the present technology.

FIG. 11 is a plan view illustrating one example of a wiring layout of the metal layer 103 in the first embodiment of the present technology. Power lines 341 and 343 and ground lines 342 and 344 are wired in the X direction on the metal layer 103. Furthermore, the power lines and the ground lines are alternately wired in the Y direction.

Figure 12:
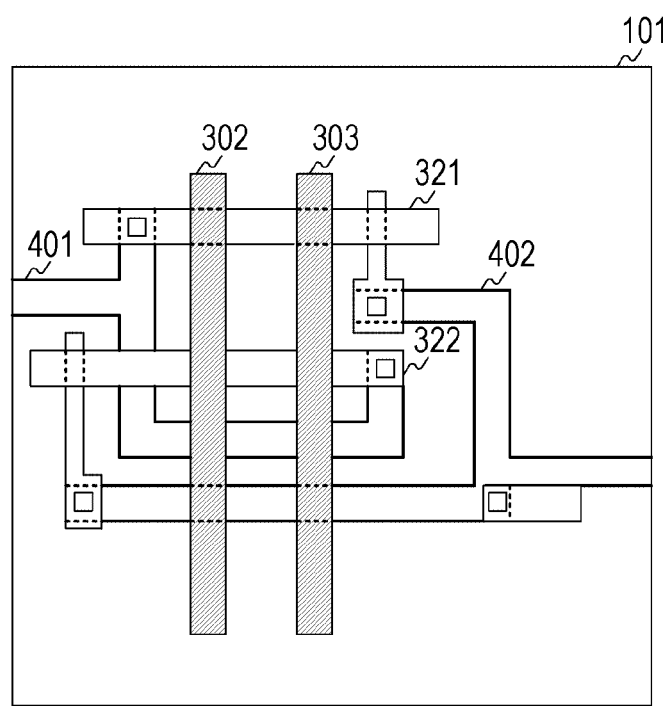
FIG. 12 is a plan view illustrating one example of a wiring layout of a transistor layer and a metal layer in the first embodiment of the present technology.

FIG. 12 is a plan view illustrating one example of a wiring layout of the transistor layer 102 and the metal layer 103 in the first embodiment of the present technology. FIG. 12 is obtained by stacking the transistor layer 102 and the metal layer 103 and enlarging a part that is not illustrated in FIGS. 10 and 11.

A clock signal line 302 and a clock signal line 303 are linearly wired in the Y direction. The clock signal line 302 transmits the clock signal CKB. The clock signal line 303 transmits the clock signal CKBB. In contrast, the data line 401 and the data line 402 are not linearly wired. The data line 401 transmits the output data Y1. The data line 402 transmits the input data SIN. For example, the data line 401 is connected to both of a transistor whose gate is connected to the clock signal line 302 and a transistor whose gate is connected to the clock signal line 303. Consequently, the data line 401 divides into two branches. One of the two branches extends in the Y direction to be connected to the transistor corresponding to the clock signal line 302. Furthermore, the other branch goes around lower parts of the clock signal lines 302 and 303 to be connected to the transistor corresponding to the clock signal line 303.

Furthermore, the data line 402 is also connected to both of a transistor whose gate is connected to the clock signal line 302 and a transistor whose gate is connected to the clock signal line 303. For this reason, the data line 402 divides into two branches. One of the two branches goes around the outside of the data line 401 to be connected to the transistor corresponding to the clock signal line 303. Furthermore, the other branch goes around lower parts of the clock signal lines 302 and 303 to be connected to the transistor corresponding to the clock signal line 302.

In this way, while the data lines 401 and 402 have a complicated wiring shape, the clock signal lines 302 and 303 have a simple wiring shape. In general, a complicated wiring shape increases the number of contacts and parasitic capacitance. The influence thereof distorts the waveform of a signal, which may cause a decrease in operation speed and an increase in power consumption.

Furthermore, a complicated wiring shape increases the number of sides and vertices in wiring shape, which increases the number of vias at the time when wiring layers are changed. This may result in an increase in manufacturing variation. This increases variations in characteristics of a circuit, and reduces yield. Moreover, advanced miniaturization causes frequent prohibition of a configuration, in which a signal line including a gate electrode is bent, due to design rules. A complicated wiring shape has difficulty in handling. In particular, in a design approach called a multi-bit cell in which a plurality of logic circuits is mounted in one large cell, the number of circuits to be mounted increases, and thus the above-described problems are much more serious.

Simplified wiring shapes of the clock signal lines 302 and 303 in the electronic device 100, however, can inhibit increases in parasitic capacitance of a clock signal line and manufacturing variation, so that excellent characteristics can be achieved in operation speed and power consumption. In contrast, although the wiring shapes of the data lines 401 and 402 are complicated, the frequency of data input/output is usually small with respect to clock signals, so that a complicated wiring shape has less influence on power consumption. For this reason, the electronic device 100 can inhibit, as a whole, influence of parasitic capacitance and manufacturing variations.

Figure 13:
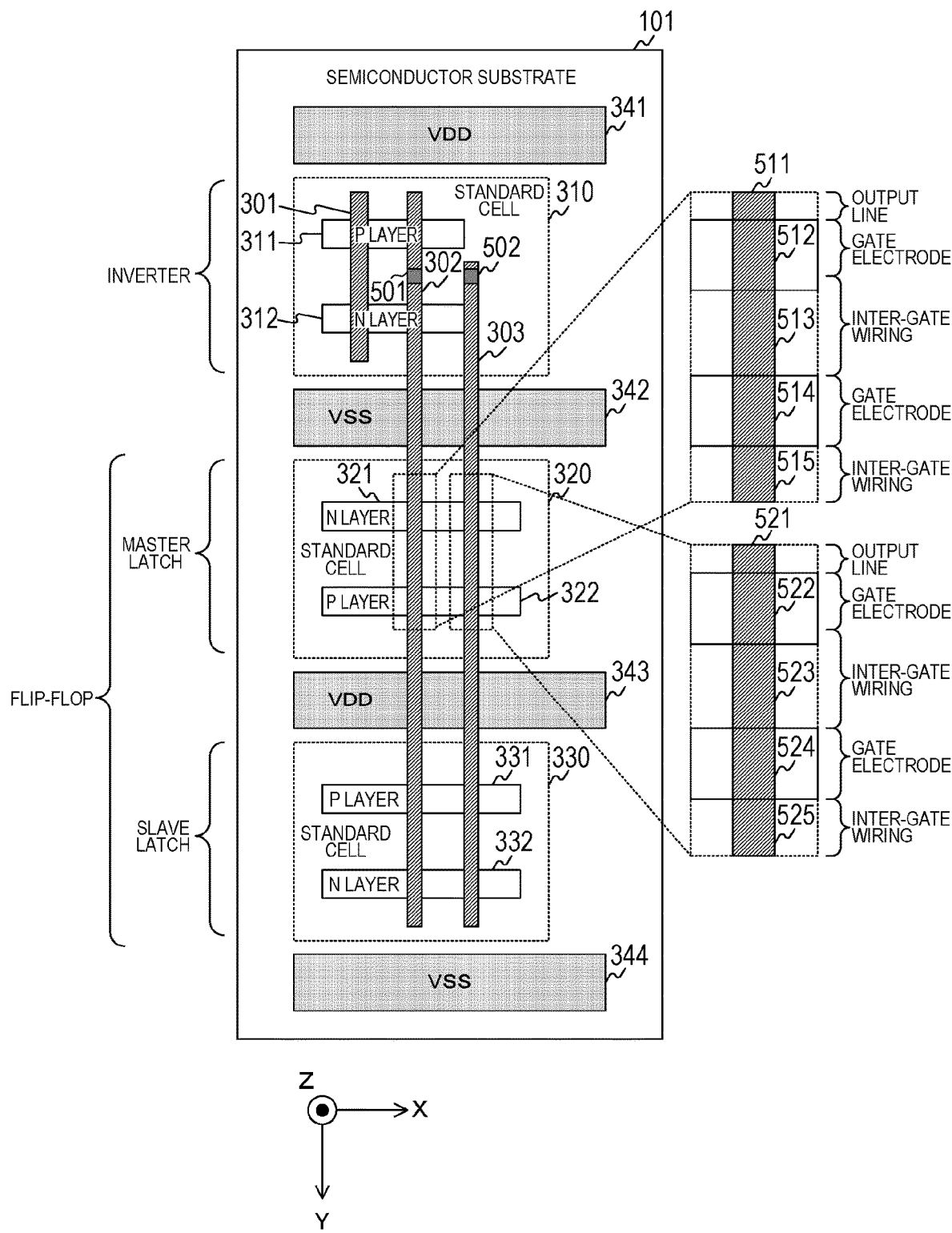
FIG. 13 is a plan view illustrating one example of a wiring layout of an inverter and a flip-flop in the first embodiment of the present technology.

FIG. 13 is a plan view illustrating one example of a wiring layout of an inverter and a flip-flop in the first embodiment of the present technology. Standard cells 310, 320, and 330 are arranged in the Y direction on the substrate plane of the semiconductor substrate 101. Here, "standard cells" mean a cell whose size (width) in the X direction and size (height) in the Y direction are standardized. That is, the standard cells 310, 320, and 330 have substantially the same width and height.

A ground line 342 is wired between the standard cells 310 and 320. Furthermore, a direction from the standard cell 330 to the standard cell 310 is defined as an upward direction. A power line 341 is wired on the upper side of the standard cell 310. Furthermore, a power line 343 is wired between the standard cells 320 and 330, and a ground line 344 is wired on the lower side of the standard cell 330.

In the standard cell 310, the P layer 311 and the N layer 312 extending in the X direction are formed, and the clock signal line 301 for transmitting the clock signal CK is wired in the Y direction. The P layer 311 is disposed on the upper side of the N layer 312. Furthermore, the clock signal line 302 and the clock signal line 303 are wired in the Y direction. The clock signal line 302 transmits the clock signal CKB. The clock signal line 303 transmits the clock signal CKBB.

Furthermore, the inverter including the P-type transistor 211 and the N-type transistor 212 and the inverter including the P-type transistor 213 and the N-type transistor 214 illustrated in FIG. 2 are disposed in the standard cell 310. These transistors are formed on the P layer 311 and the N layer 312. Furthermore, a contact 501 is provided on the clock signal line 302. The contact 501 is an output terminal of an inverter including the P-type transistor 211 and the N-type transistor 212. In contrast, a contact 502 is provided on the clock signal line 303. The contact 502 is an output terminal of an inverter including the P-type transistor 213 and the N-type transistor 214.

Note that the contact 501 is one example of a positive output terminal set forth in the claims, and the contact 502 is one example of a negative output terminal set forth in the claims. Furthermore, the clock signal line 302 is one example of a positive signal line set forth in the claims, and the clock signal line 303 is one example of a negative signal line set forth in the claims.

In the standard cell 320, an N layer 321 and a P layer 322 extending in the X direction are formed, and the clock signal lines 302 and 303 pass in the Y direction. The N layer 321 is disposed on the upper side of the P layer 322. Furthermore, the master latch 250 illustrated in FIG. 7 is disposed in the standard cell 320.

Furthermore, a gate electrode 514 of an N-type transistor formed in the P layer 322 and a gate electrode 512 of a P-type transistor formed in the N layer 321 are arranged in the Y direction. The gate electrode 512 is connected to the contact 501 via an output line 511. Inter-gate wirings 513 and 515 are wired between the gate electrodes. For example, the output line 511, the gate electrode 512, the inter-gate wiring 513, the gate electrode 514, and the inter-gate wiring 515 form the clock signal line 302. Similarly, the clock signal line 303 is also formed by, for example, an output line 521, a gate electrode 522, an inter-gate wiring 523, a gate electrode 524, and an inter-gate wiring 525. The gate electrode 512 in FIG. 13 corresponds to the gate electrode of the P-type transistor in the clocked inverter 253 in FIG. 7. The gate electrode 514 in FIG. 13 corresponds to the gate electrode of the N-type transistor 252 in FIG. 7. The gate electrode 522 in FIG. 13 corresponds to the gate electrode of the P-type transistor 251 in FIG. 7. The gate electrode 514 in FIG. 13 corresponds to the gate electrode of the N-type transistor in the clocked inverter 253 in FIG. 7.

In the standard cell 330, a P layer 331 and an N layer 332 extending in the X direction are formed, and the clock signal lines 302 and 303 are wired in the Y direction. The P layer 331 is disposed on the upper side of the N layer 332. Furthermore, the slave latch 260 illustrated in FIG. 8 is disposed in the standard cell 330.

Note that the standard cell 310 is one example of an output circuit set forth in the claims, and the standard cells 320 and 330 are examples of a logic circuit set forth in the claims. Furthermore, the P-type transistor in the clocked inverter 253 and the N-type transistor 252 are examples of a plurality of positive transistors set forth in the claims. Furthermore, the P-type transistor 251 and the N-type transistor in the clocked inverter 253 are examples of a plurality of negative transistors set forth in the claims.

Here, a configuration, in which an inverter, a master latch, and a slave latch are arranged in the X direction and clock signal lines are wired in the Y direction in those latches, is assumed. In the configuration, the clock signal line needs to be bent or divided in the middle, and the wiring shape is complicated.

In contrast, an inverter, a master latch, and a slave latch are arranged in the Y direction, and the clock signal lines 302 and 303 are also wired in the Y direction in the electronic device 100. This configuration can simplify the shape of the clock signal lines, and inhibit increases in parasitic capacitance and manufacturing variation.

Even if an inverter and a latch are not arranged in the Y direction, wiring layers in stacking structure can simplify the wiring shape. A plurality of layers, however, increases parasitic capacitance, and causes harmful effects such as a decrease in operation speed and an increase in power consumption. Furthermore, if the wiring resources are secured by increasing the height and width of a standard cell, the wiring shape can be slightly simplified. A mounting area, however, is increased.

Arranging an inverter and a latch in the Y direction can simplify the wiring shape of a clock signal line without making wiring layers in stacking structure or increasing a cell size.

Note that, although one master latch and one slave latch, that is, one flip-flop is disposed, two or more flip-flops can be disposed. This can achieve, for example, a shift register. Furthermore, although a master latch is disposed above a slave latch, the slave latch can be conversely disposed above the master latch.

Figure 14:
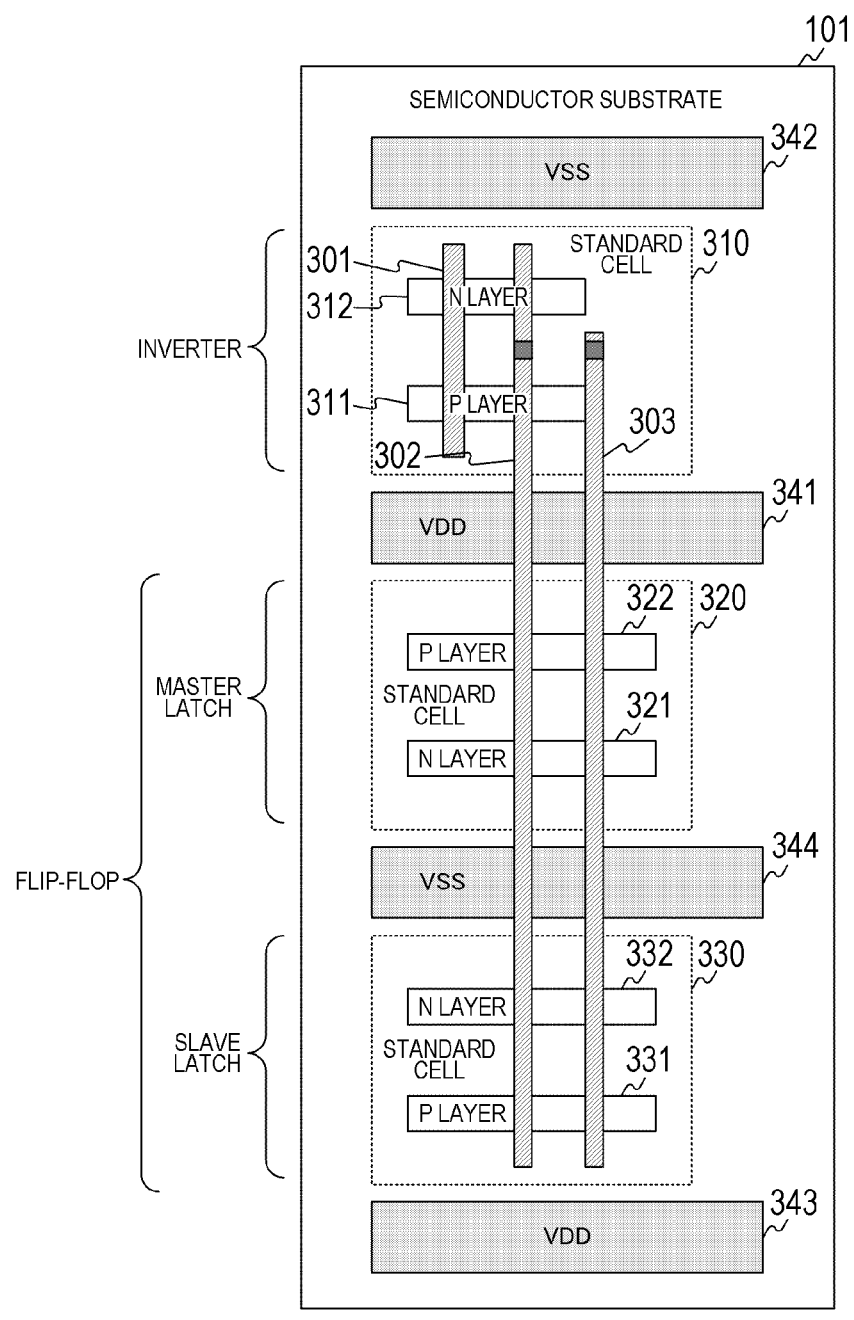
FIG. 14 is a plan view illustrating one example of a wiring layout of an inverter and a flip-flop, in which the vertical relationship of a power line and a ground line is turned upside down, in the first embodiment of the present technology.
Figure 14:
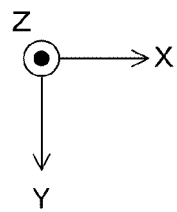

Note that, although the power line 341 is wired on the upper side of the ground line 342, the vertical relationship may be turned upside down as illustrated in FIG. 14. In the case, the ground line 344 and the power line 343 are required to be turned upside down, and the P layer and N layer of each of the standard cells 310, 320, and 330 are also required to be turned upside down.

Figure 15:
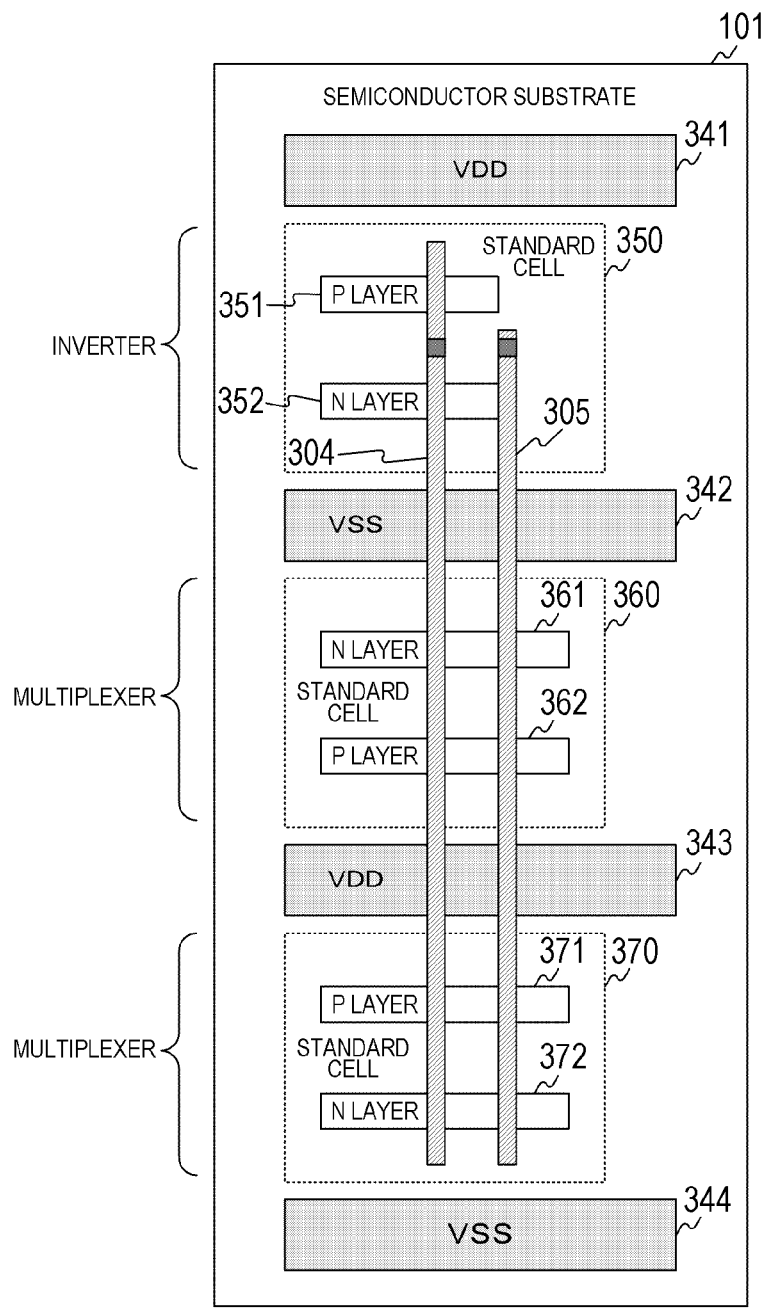
FIG. 15 is a plan view illustrating one example of a wiring layout of an inverter and multiplexers in the first embodiment of the present technology.
Figure 15:
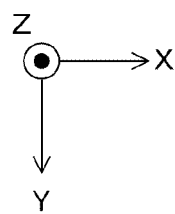

FIG. 15 is a plan view illustrating one example of a wiring layout of an inverter and multiplexers in the first embodiment of the present technology. Standard cells 350, 360, and 370 are arranged in the Y direction on the substrate plane of the semiconductor substrate 101.

In the standard cell 350, a P layer 351 and an N layer 352 extending in the X direction are formed, and a selection signal line 304 and a selection signal line 305 are wired in the Y direction. The selection signal line 304 transmits the selection signal SEL. The selection signal line 305 transmits the selection signal SELB. Furthermore, the inverter 215 illustrated in FIG. 2 is disposed in the standard cell 350.

Note that the selection signal line 304 is one example of a positive signal line set forth in the claims, and the selection signal line 305 is one example of a negative signal line set forth in the claims.

In the standard cell 360, an N layer 361 and a P layer 362 extending in the X direction are formed, and the selection signal lines 304 and 305 pass in the Y direction. The N layer 361 is disposed on the upper side of the P layer 362. Furthermore, the multiplexer 203 illustrated in FIG. 3 is disposed in the standard cell 360.

In the standard cell 370, a P layer 371 and an N layer 372 extending in the X direction are formed, and the selection signal lines 304 and 305 are wired in the Y direction. The P layer 371 is disposed on the upper side of the N layer 372. Furthermore, the multiplexer 220 illustrated in FIG. 3 is disposed in the standard cell 370.

Note that the standard cell 350 is one example of an output circuit set forth in the claims, and the standard cells 360 and 370 are examples of a logic circuit set forth in the claims.

As described above, the inverter and the multiplexers arranged in the Y direction and the selection signal lines 304 and 305 wired in the Y direction can simplify the shape of the selection signal line, and inhibit increases in parasitic capacitance and manufacturing variation.

In this way, in the first embodiment of the present technology, the inverters, latches, and multiplexers are arranged in the Y direction, and a pair of clock signal lines 302 and 303 for transmitting a differential signal is linearly wired in the Y direction. The configuration thus can simplify the shape. This configuration can inhibit increases in parasitic capacitance and manufacturing variation.

2. Second Embodiment

In the above-described first embodiment, the selection signal SEL is inverted in the semiconductor integrated circuit 200. Unfortunately, an inverter that performs inversion increases a circuit scale in the semiconductor integrated circuit 200. An electronic device 100 of a second embodiment is different from that of the first embodiment in that the inverter is reduced.

Figure 16:
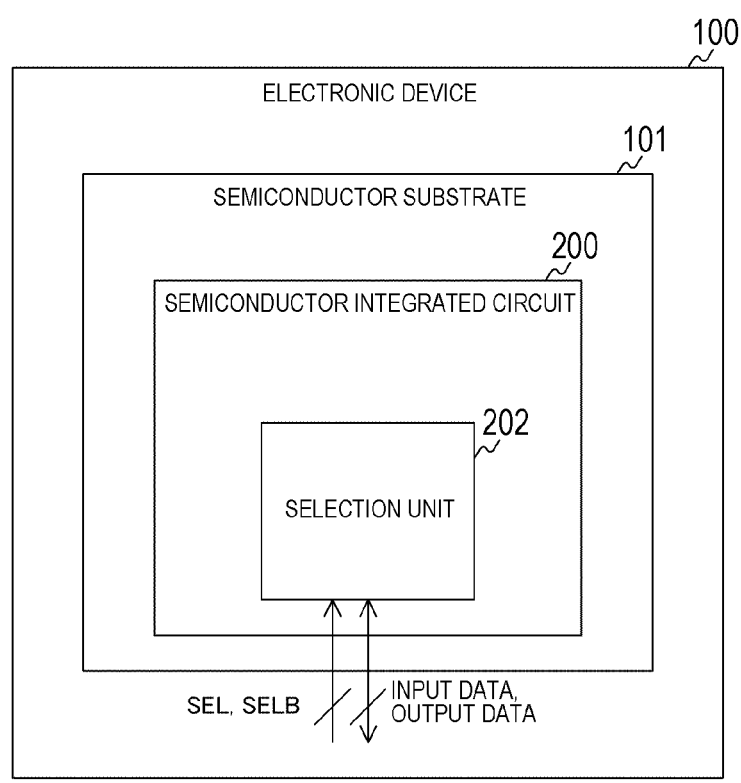
FIG. 16 is a block diagram illustrating one configuration example of an electronic device in a second embodiment of the present technology.

FIG. 16 is a block diagram illustrating one configuration example of the electronic device 100 in the second embodiment of the present technology. The electronic device 100 of the second embodiment is different from that of the first embodiment in that a distribution unit 201 and a holding unit 204 are not disposed in a semiconductor integrated circuit 200.

Figure 17:
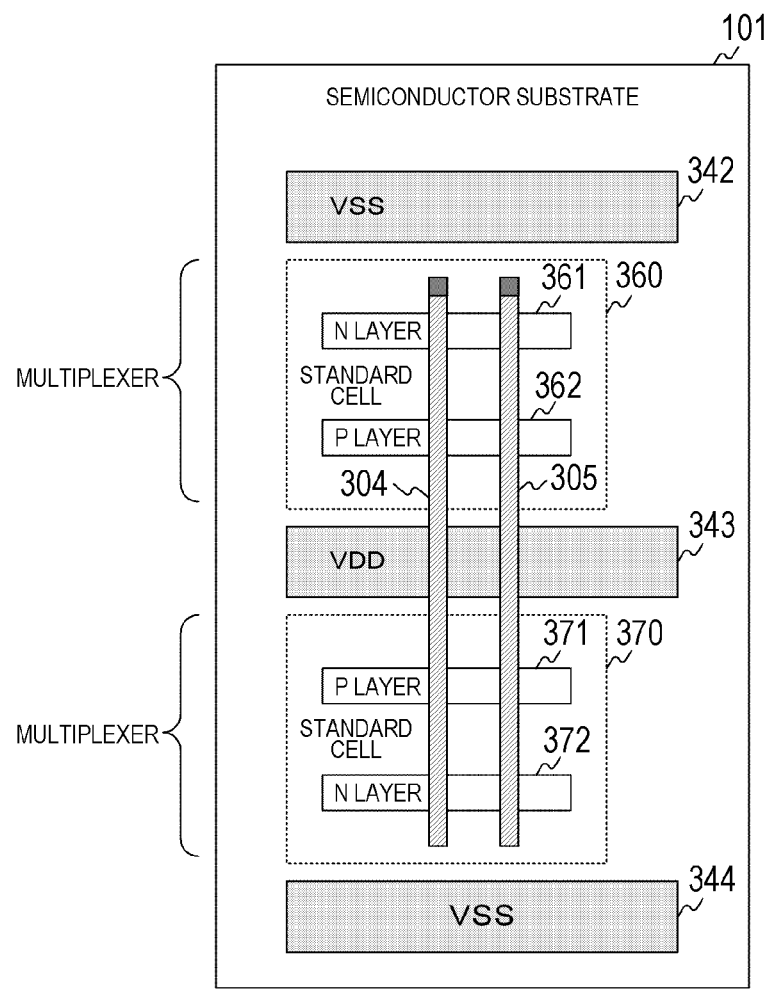
FIG. 17 is a plan view illustrating one example of a wiring layout of multiplexers in the second embodiment of the present technology.

FIG. 17 is a plan view illustrating one example of a wiring layout of multiplexers in the second embodiment of the present technology. A semiconductor substrate 101 of the second embodiment is different from that of the first embodiment in that a standard cell 350 on which an inverter is disposed is not provided. Furthermore, a contact is provided at one end of each of selection signal lines 304 and 305 in a standard cell 360 in which a multiplexer is disposed.

Note that the standard cell 360 is one example of an output circuit in the claims, and a standard cell 370 is one example of a logic circuit in the claims. Furthermore, a multiplexer disposed in the standard cell 360 is one example of a first multiplexer set forth in the claims, and a multiplexer disposed in the standard cell 370 is one example of a second multiplexer set forth in the claims.

Note that, although the holding unit 204 is not disposed in the semiconductor integrated circuit 200 of the second embodiment, a holding unit 204 can be further disposed. In the case, in the wiring layout illustrated sin FIG. 13, the standard cell 310 on which the inverter is disposed is required to be reduced.

In this way, the inverter is reduced in the second embodiment of the present technology, and accordingly the circuit scale of the semiconductor integrated circuit 200 can be reduced.

3. Third Embodiment

In the above-described first embodiment, the multiplexers 203 and 220 achieve the 4-input 2-output circuit. Unfortunately, two multiplexers may fail to perform handling in a case where the number of pieces of input/output data is increased. A semiconductor integrated circuit 200 of a third embodiment is different from that of the first embodiment in that the number of multiplexers is increased.

Figure 18:
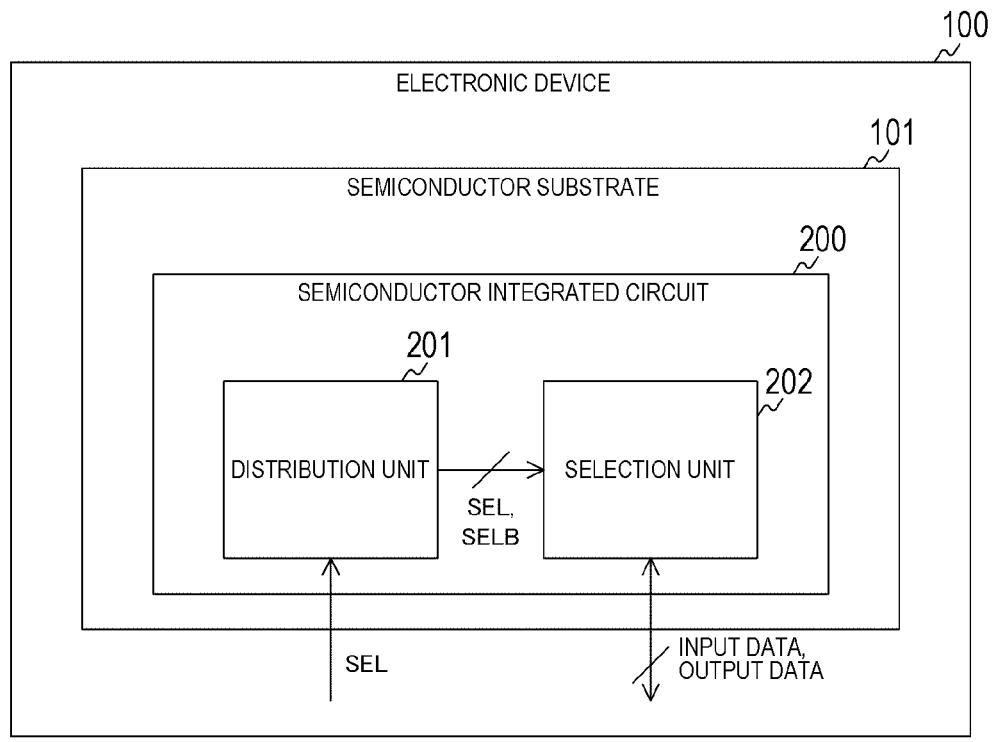
FIG. 18 is a block diagram illustrating one configuration example of an electronic device in a third embodiment of the present technology.

FIG. 18 is a block diagram illustrating one configuration example of an electronic device 100 in the third embodiment of the present technology. The electronic device 100 of the third embodiment is different from that of the first embodiment in that a holding unit 204 is not provided in the semiconductor integrated circuit 200.

Figure 19:
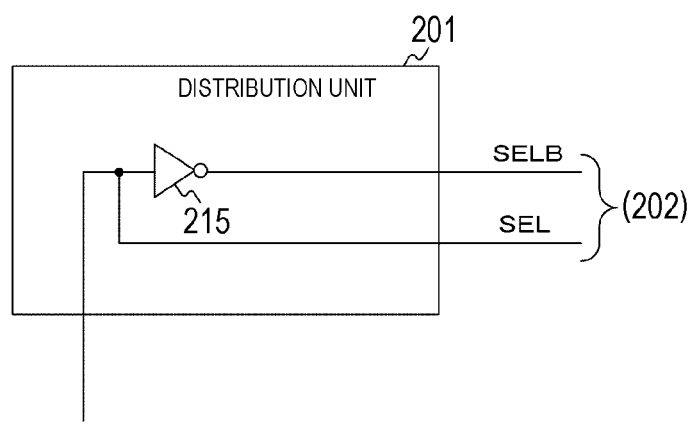
FIG. 19 is a circuit diagram illustrating one configuration example of a distribution unit in the third embodiment of the present technology.

FIG. 19 is a block diagram illustrating one configuration example of a distribution unit 201 in the third embodiment of the present technology. The distribution unit 201 of the third embodiment is different from that of the first embodiment in that the distribution unit 201 does not include the P-type transistors 211 and 213 and the N-type transistors 212 and 214.

Figure 20:
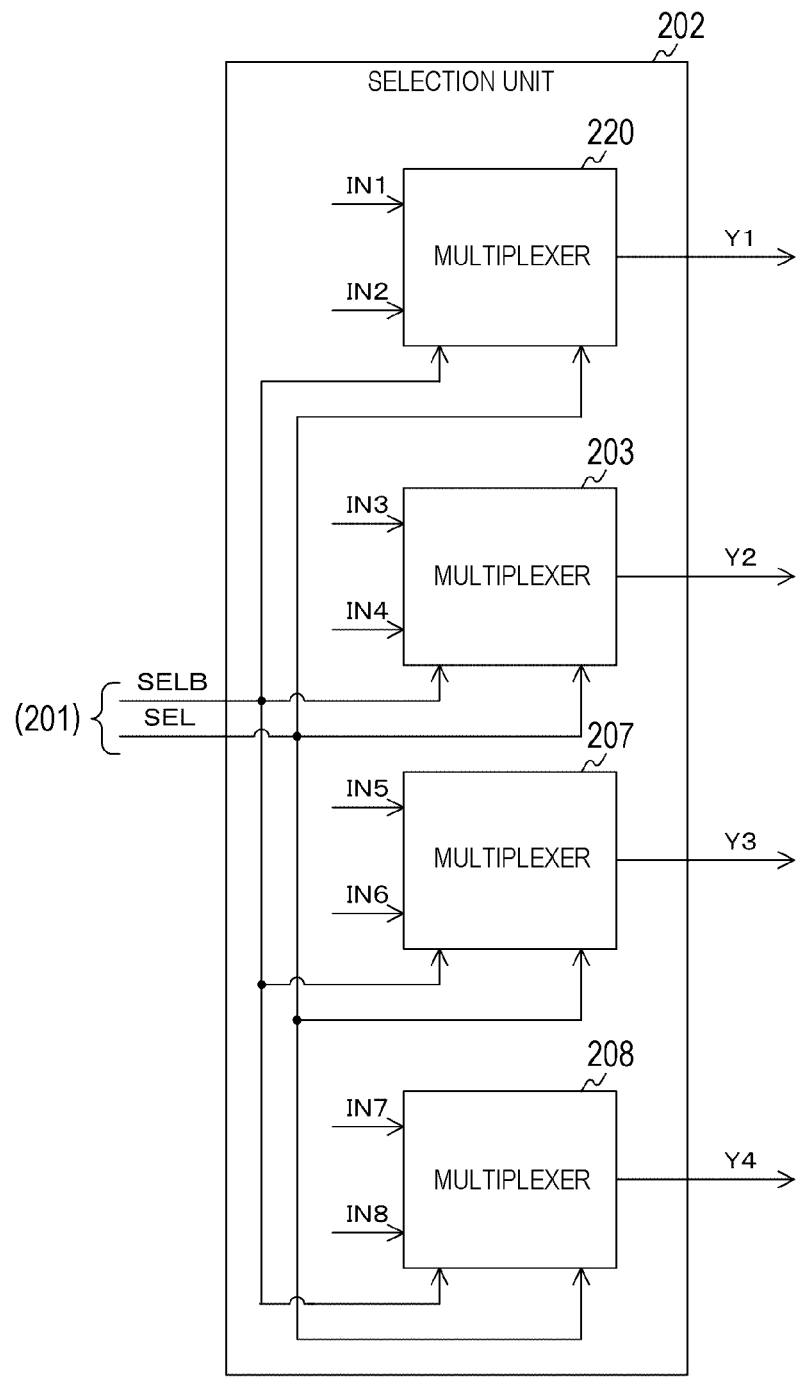
FIG. 20 is a block diagram illustrating one configuration example of a selection unit in the third embodiment of the present technology.

FIG. 20 is a block diagram illustrating one configuration example of a selection unit 202 in the third embodiment of the present technology. The selection unit 202 of the third embodiment is different from that of the first embodiment in that the selection unit 202 further includes multiplexers 207 and 208.

The circuit configurations of the multiplexers 207 and 208 are similar to that of the multiplexer 220. The multiplexer 207 selects one of pieces of input data IN5 and IN6 in accordance with the selection signals SEL and SELB, and outputs the selected input data as output data Y3. Furthermore, the multiplexer 208 selects one of pieces of input data IN7 and IN8 in accordance with the selection signals SEL and SELB, and outputs the selected input data as output data Y4.

Figure 21:
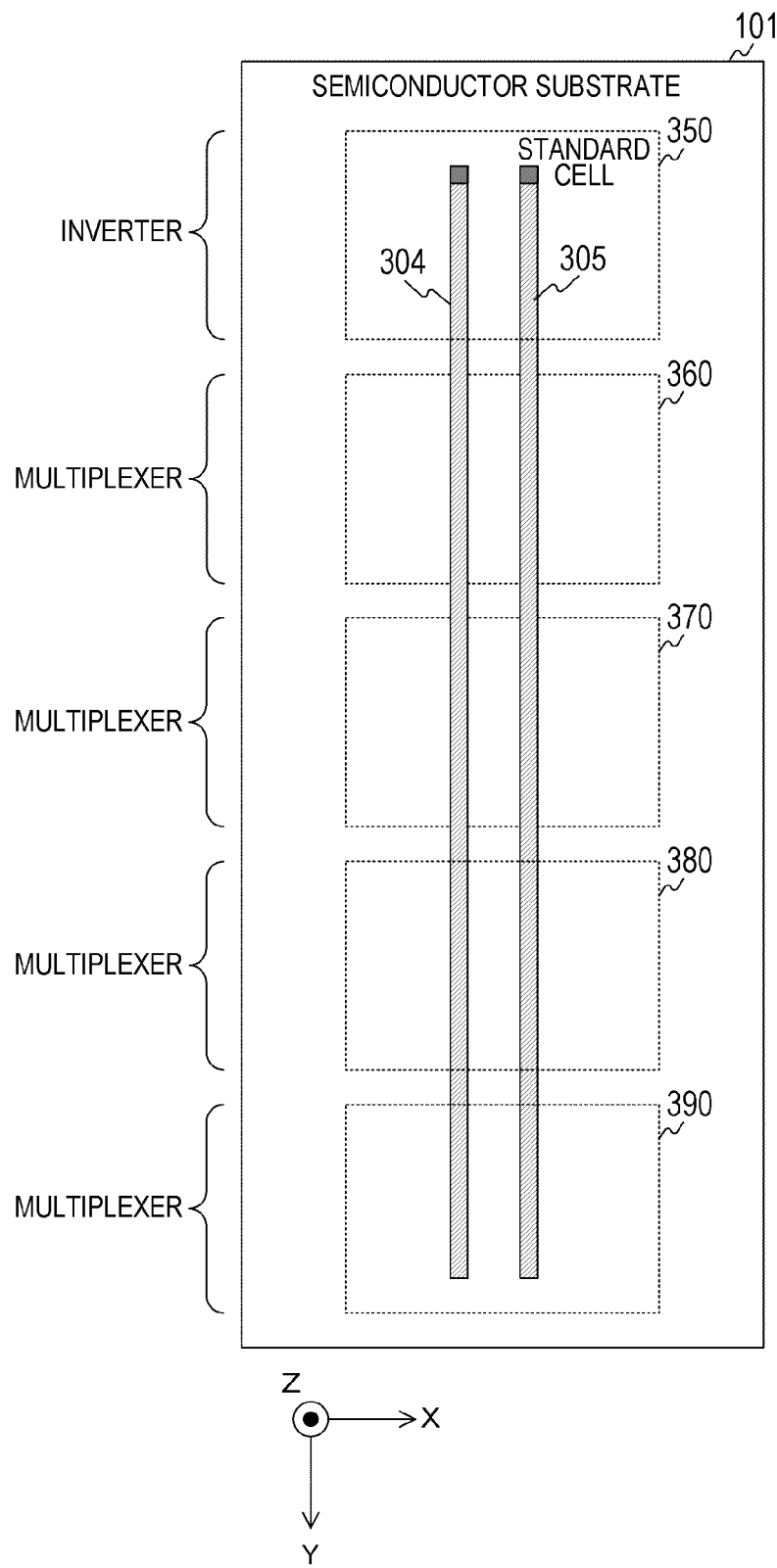
FIG. 21 is a plan view illustrating one example of a wiring layout of an inverter and multiplexers in the third embodiment of the present technology.

FIG. 21 is a plan view illustrating one example of a wiring layout of an inverter and multiplexers in the third embodiment of the present technology. Standard cells 380 and 390 are further disposed on a semiconductor substrate 101 of the third embodiment. Note that, in the figure, a P layer, an N layer, a power line, and a ground line are omitted.

Standard cells 350, 360, 370, 380, and 390 are arranged in the Y direction in the order from above. Furthermore, the multiplexer 207 is disposed in the standard cell 380, and the multiplexer 208 is disposed in the standard cell 390.

Figure 22:
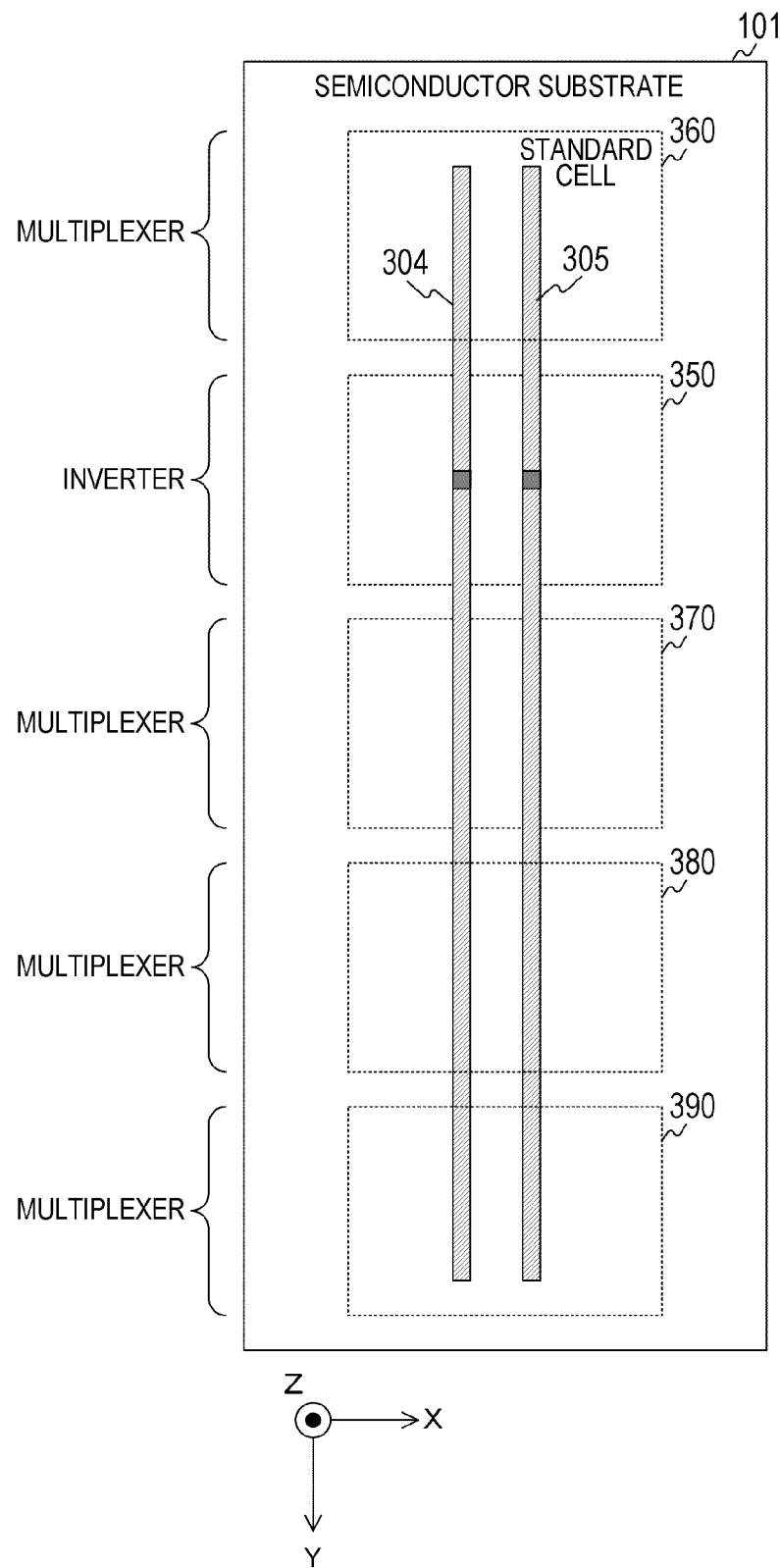
FIG. 22 is a plan view illustrating one example of a wiring layout in which the position of an inverter is changed in the third embodiment of the present technology.

Although the standard cell 350 including an inverter is disposed on the uppermost side in FIG. 21, the position of the inverter is not limited to the uppermost position. For example, as illustrated in FIG. 22, the inverter can be disposed on the second top.

Note that, although four multiplexers are disposed in the electronic device 100, the number of multiplexers is not limited to four.

In this way, in the third embodiment of the present technology, the number of multiplexers is increased from two to four, so that the number of pieces of input/output data can be increased from 4-input 2-output to 8-input 4-output.

4. Fourth Embodiment

In the above-described third embodiment, the standard cells have a uniform size. If circuits in certain standard cells are complicated, however, the circuits may fail to be disposed in a regulation size. An electronic device 100 of a fourth embodiment is different from that of the third embodiment in that the sizes of some standard cells are expanded.

Figure 23:
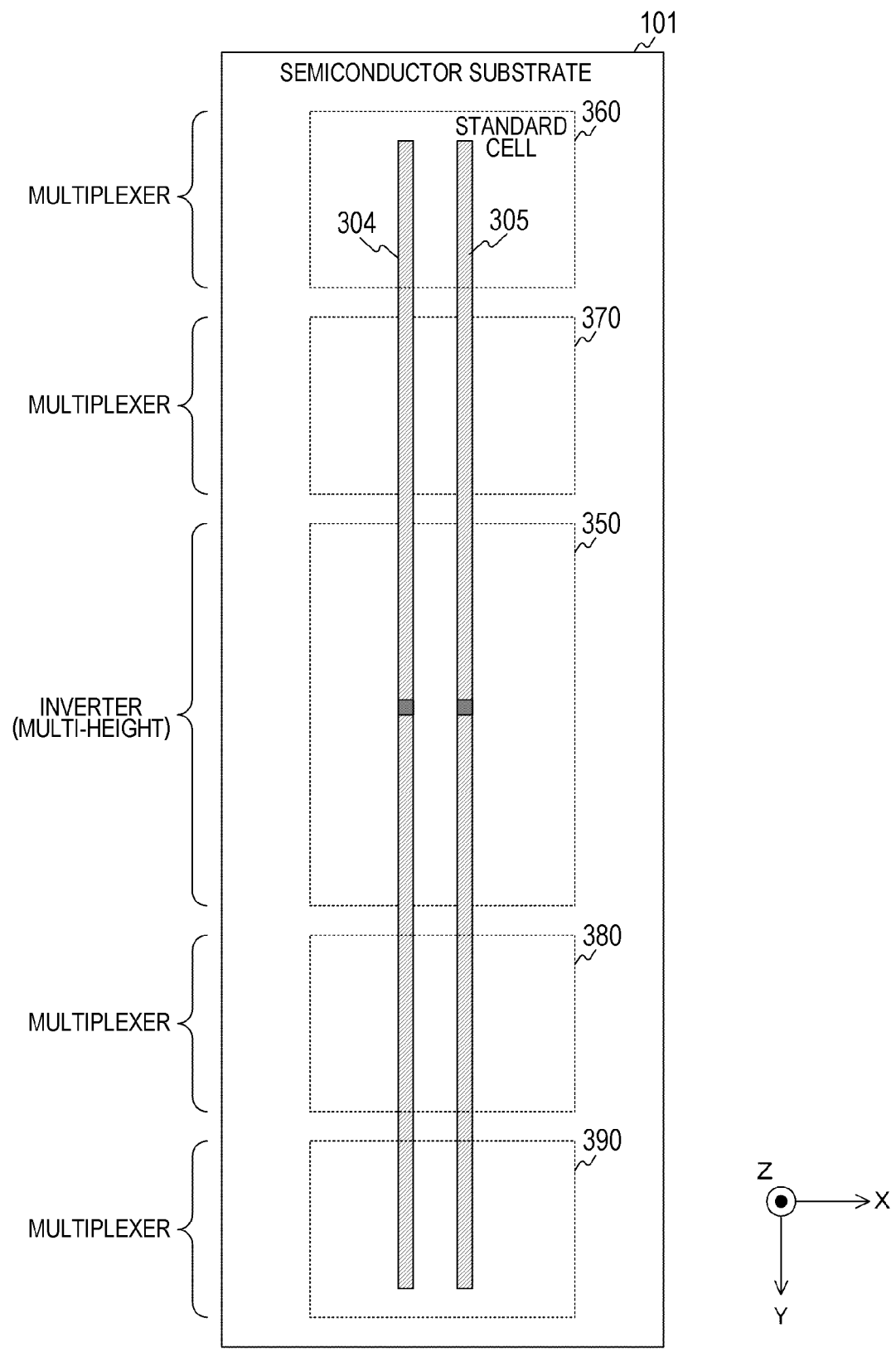
FIG. 23 is a plan view illustrating one example of a wiring layout of an inverter and multiplexers in a fourth embodiment of the present technology.

FIG. 23 is a plan view illustrating one example of a wiring layout of an inverter and multiplexers in the fourth embodiment of the present technology. The wiring layout of the fourth embodiment is different from that of the third embodiment in that the height of a standard cell 350 corresponding to an inverter is twice that of the other standard cells. Note that the height of the standard cell 350 may be three times or more that of other standard cells. In this way, a standard cell having a height higher than a specified value is called a multi-height standard cell.

Figure 24:
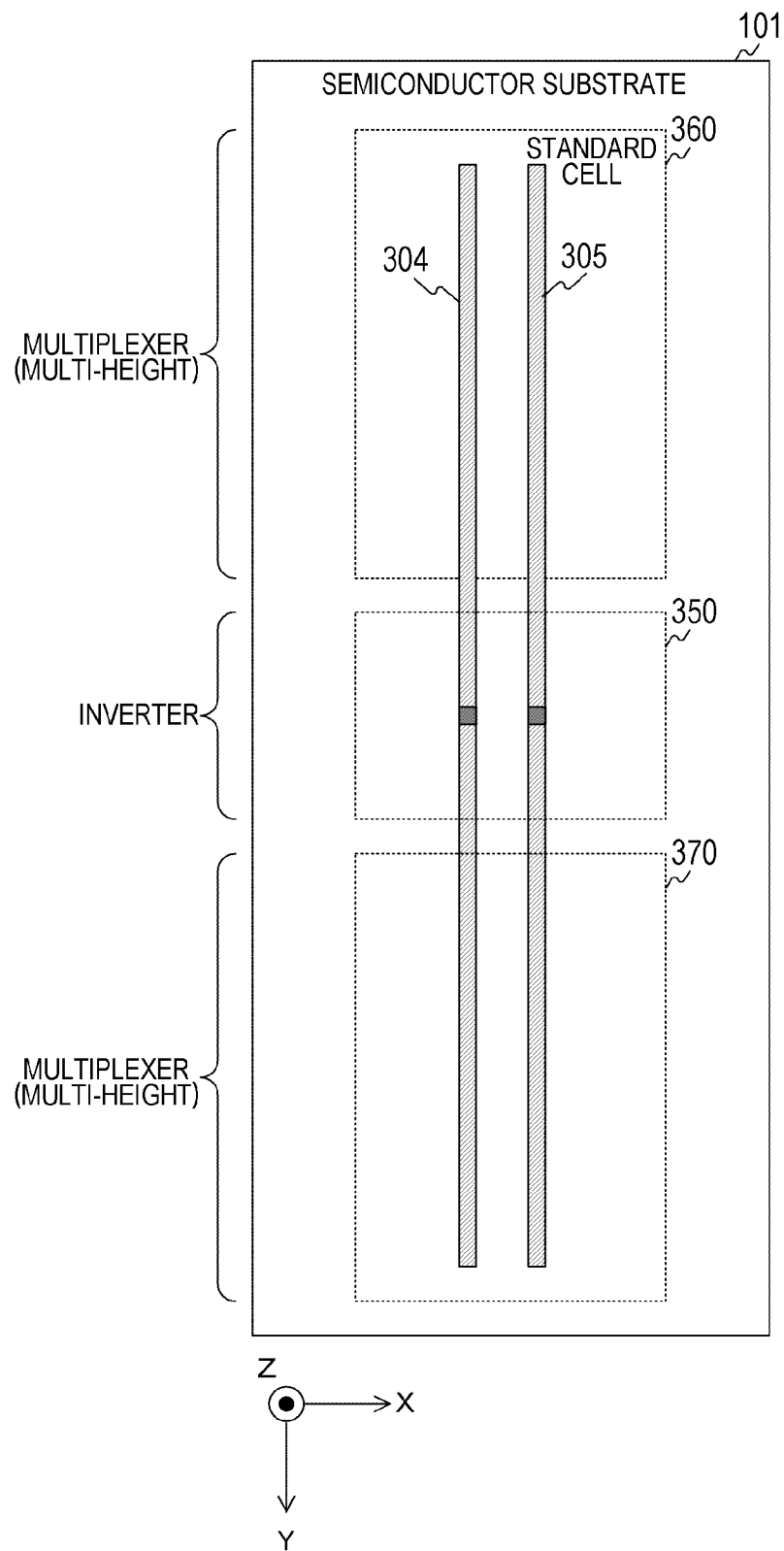
FIG. 24 is a plan view illustrating one example of a wiring layout in which the height of multiplexers is changed in the fourth embodiment of the present technology.

Note that, although the standard cell 350 in which the inverter is disposed is made multi-height, the configuration is not limitative. As illustrated in FIG. 24, the height of the standard cell 350 can be set to a specified value, and the standard cell 360 or 370 in which a multiplexer is disposed can be made multi-height. Furthermore, a standard cell in which a latch is disposed can be made multi-height.

In this way in the fourth embodiment of the present technology, the standard cell 350 has a height higher than other standard cells, so that a circuit more complicated than the other standard cells can be disposed in the standard cell 350.

5. Fifth Embodiment

In the above-described third embodiment, the multiplexers are arranged only in the Y direction. Increasing the number of multiplexers increases the size of the semiconductor integrated circuit 200 in the Y direction. As a result, the semiconductor integrated circuit 200 may fail to stay in the semiconductor substrate 101. An electronic device 100 of a fifth embodiment is different from that of the third embodiment in that multiplexers are arranged in the X direction in addition to the Y direction.

Figure 25:
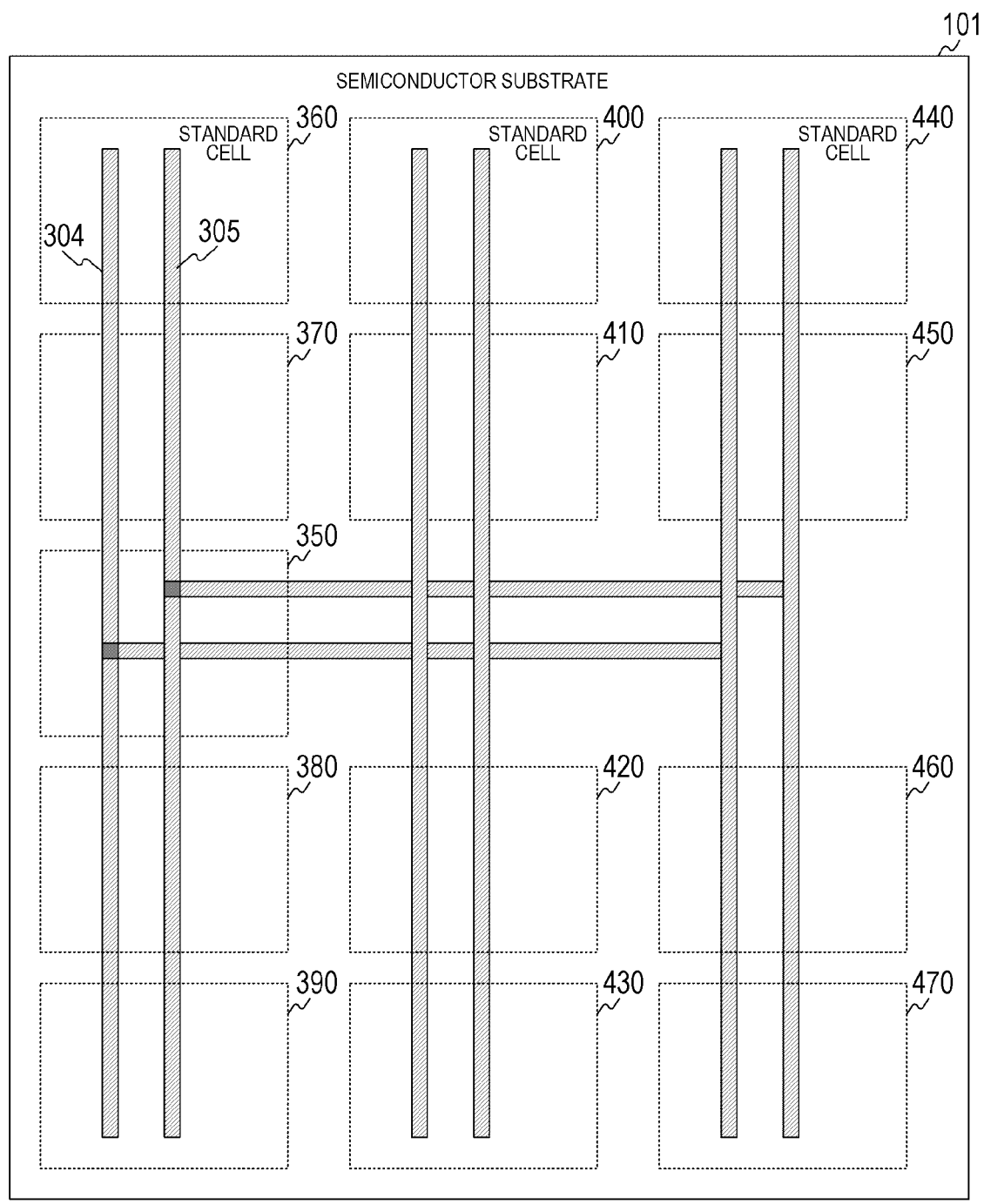
FIG. 25 is a plan view illustrating one example of a wiring layout in a fifth embodiment of the present technology.
Figure 25:
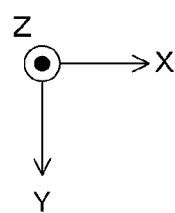

FIG. 25 is a plan view illustrating one example of a wiring layout in the fifth embodiment of the present technology. Standard cells 400, 410, 420, 430, 440, 450, 460, and 470 are further disposed on a semiconductor substrate 101 of the fifth embodiment. For example, multiplexers are disposed in these added standard cells.

For example, a standard cell 350 provided with an inverter is disposed on the third top. Furthermore, cells other than the standard cell 350 are arranged in the X and Y directions. In other words, the cells are arranged in a two-dimensional lattice pattern. For example, other standard cells are arranged in 2 rows×3 columns on each of the upper and lower sides of the standard cell 350.

Selection signal lines 304 and 305 are wired in the Y direction in the column including the standard cell 350. Furthermore, these selection signal lines are divided in the X direction in the standard cell 350, and further divided in the Y direction in the other two columns not including the standard cell 350.

Figure 26:
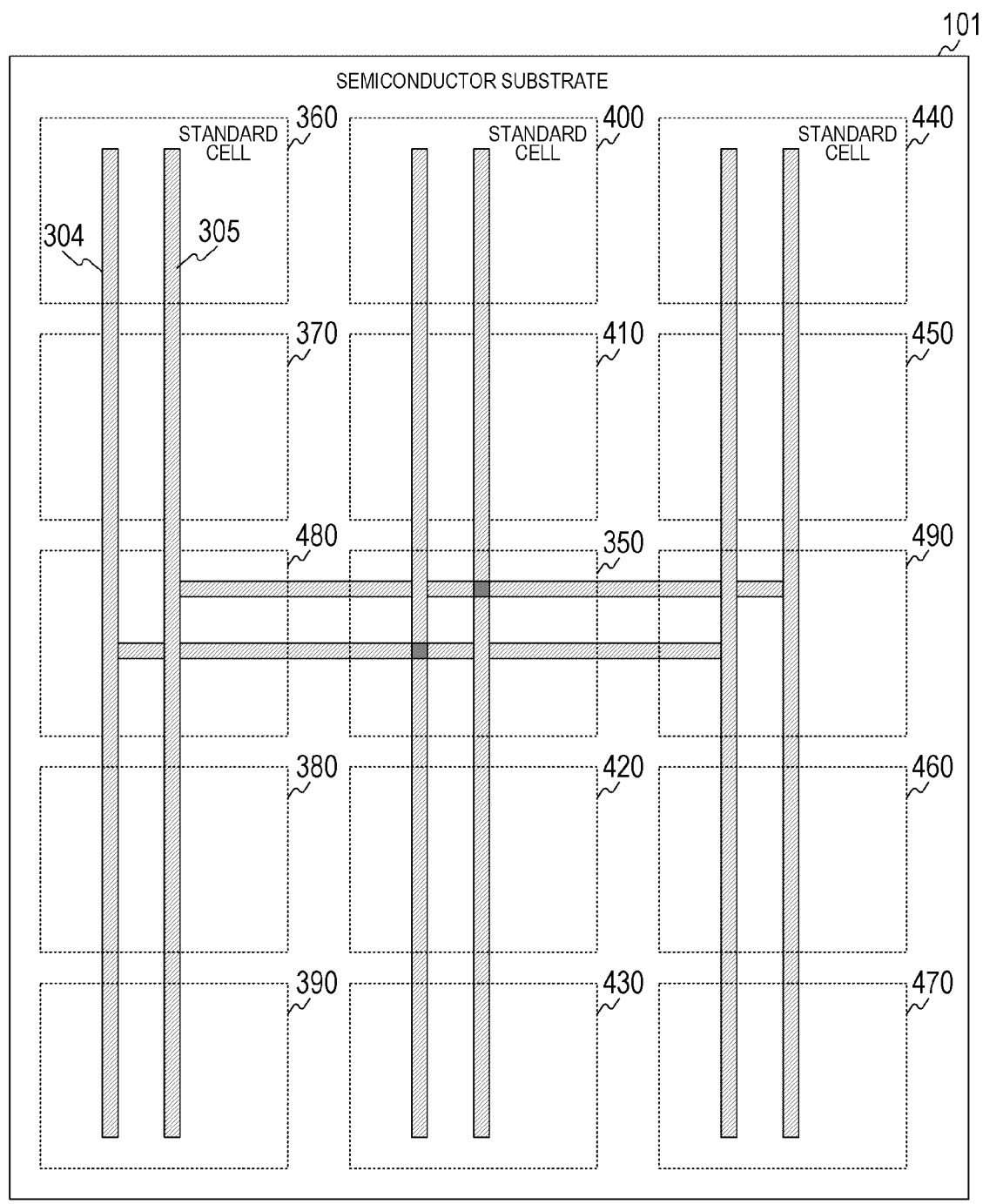
FIG. 26 is a plan view illustrating one example of a wiring layout in which a standard cell is added in the fifth embodiment of the present technology.

Note that, although another standard cell is not arranged in a row of the standard cell 350 provided with the inverter, standard cells can further be arranged on both sides of the standard cell 350 as illustrated in FIG. 26.

Furthermore, in addition to the multiplexers, standard cells provided with a latch can be arranged in the X and Y directions. Arranging standard cells provided with a latch in a two-dimensional lattice pattern can achieve, for example, a multi-bit flip-flop holding a plurality of bits.

In this way, in the fifth embodiment of the present technology, the standard cells are arranged in a two-dimensional lattice pattern. Thus, an increase in size of the semiconductor integrated circuit 200 in the Y direction can be inhibited even if the number of standard cells is increased.

6. Sixth Embodiment

In the above-described third embodiment, one inverter generates one differential signal to control four multiplexers. One inverter cannot control these multiplexers by using a plurality of differential signals. An electronic device 100 of a sixth embodiment is different from that of the third embodiment in that the number of inverters is increased.

Figure 27:
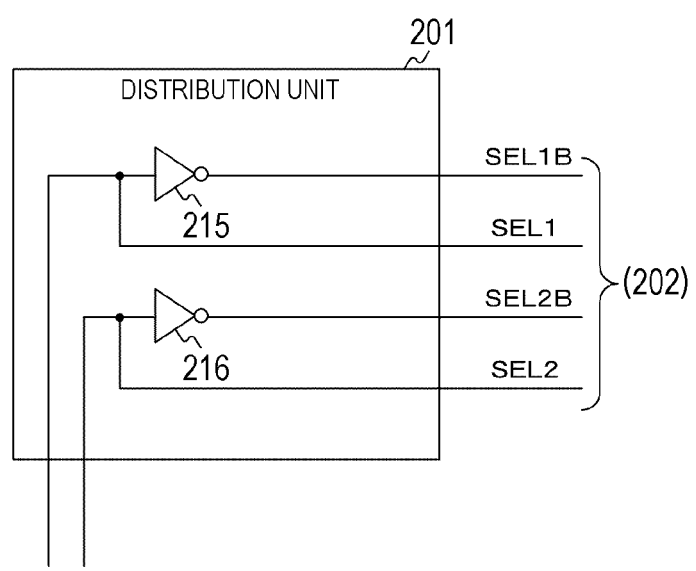
FIG. 27 is a circuit diagram illustrating one configuration example of a distribution unit in a sixth embodiment of the present technology.

FIG. 27 is a circuit diagram illustrating one configuration example of a distribution unit 201 in the sixth embodiment of the present technology. The distribution unit 201 in the sixth embodiment is different from that of the third embodiment in that the distribution unit 201 further includes an inverter 216.

A selection signal SEL1 is input to an inverter 215, and a selection signal SEL2 is input to the inverter 216. The inverter 215 inverts the selection signal SEL1 to generate a selection signal SEL1B, and supplies the selection signal SEL1B to a selection unit 202. The inverter 216 inverts the selection signal SEL2 to generate a selection signal SEL2B, and supplies the selection signal SEL2B to the selection unit 202.

Note that a differential signal including the selection signals SEL1 and SEL1B is one example of a first differential signal set forth in the claims, and a differential signal including the selection signals SEL2 and SEL2B is one example of a second differential signal set forth in the claims. Furthermore, the inverter 215 is one example of a first inverter set forth in the claims, and the inverter 216 is one example of a second inverter set forth in the claims.

Figure 28:
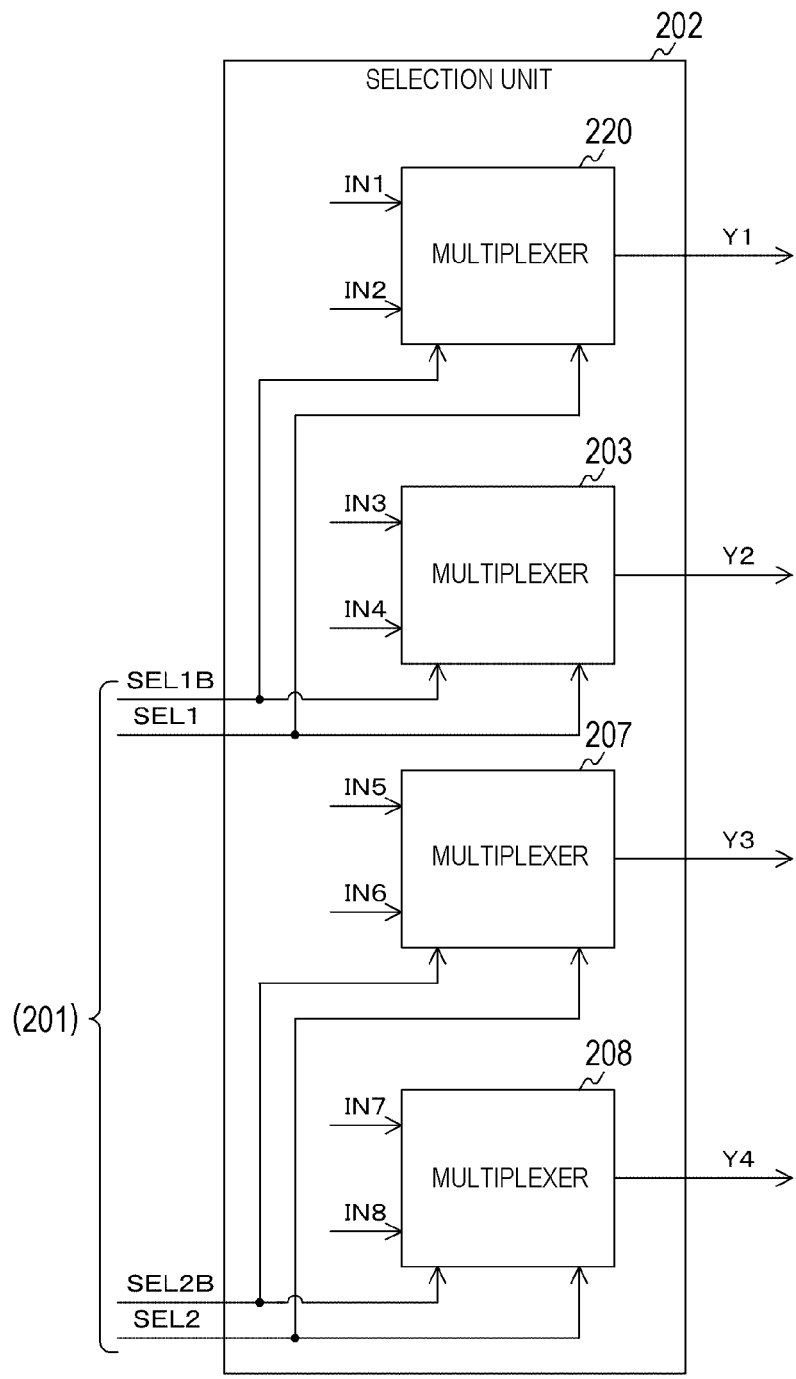
FIG. 28 is a block diagram illustrating one configuration example of a selection unit in the sixth embodiment of the present technology.

FIG. 28 is a circuit diagram illustrating one configuration example of the selection unit 202 in the sixth embodiment of the present technology. Multiplexers 203 and 220 in the sixth embodiment select one of two pieces of input data in accordance with the selection signals SEL1 and SEL1B. Furthermore, multiplexers 207 and 208 select one of two pieces of input data in accordance with the selection signals SEL2 and SEL2B.

Figure 29:
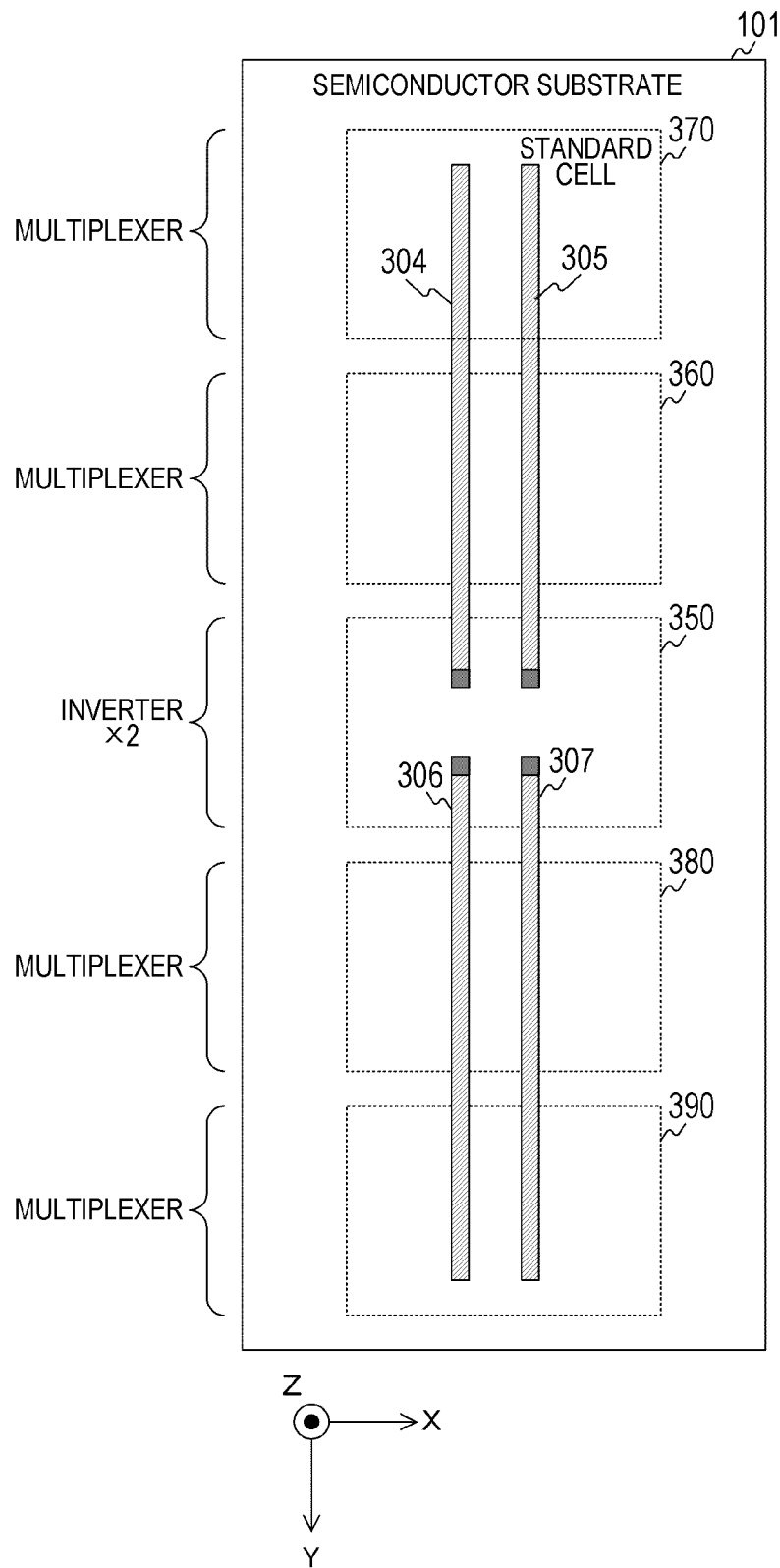
FIG. 29 is a plan view illustrating one example of a wiring layout of an inverter and multiplexers in the sixth embodiment of the present technology.

FIG. 29 is a plan view illustrating one example of a wiring layout of an inverter and multiplexers in the sixth embodiment of the present technology. In the sixth embodiment, a standard cell 350 is disposed on the third top. The inverters 215 and 216 illustrated in FIG. 27 are disposed in the standard cell 350.

Furthermore, selection signal lines 304 and 305 are wired along the Y direction upward from the standard cell 350, and selection signal lines 306 and 307 are wired along the Y direction downward from the standard cell 350. The standard cell 350 supplies the selection signals SEL1 and SEL1B to standard cells 360 and 370 via the selection signal lines 304 and 305. Furthermore, the standard cell 350 supplies the selection signals SEL2 and SEL2B to standard cells 380 and 390 via the selection signal lines 306 and 307.

Note that the standard cells 360 and 370 are examples of a first circuit set forth in the claims, and the standard cells 380 and 390 are examples of a second circuit set forth in the claims.

Note that, although the standard cell 350 supplies two differential signals with two inverters, the number of inverters and that of differential signals are not limited to two. The standard cell 350 can supply three or more differential signals with three or more inverters.

In this way, in the sixth embodiment of the present technology, the number of inverters is increased from one to two, so that two differential signals can be supplied to a plurality of multiplexers.

7. Seventh Embodiment

In the above-described third embodiment, the inverter supplies a differential signal to the multiplexer arranged in the same column via the selection signal lines 304 and 305 linearly wired along the Y direction. In a case where a circuit or element other than the multiplexer is arranged in the same column as a column in which the inverter is placed, however, some multiplexers sometimes cannot be arranged in the same column due to the disposition of, for example, the circuit. An electronic device 100 of a seventh embodiment is different from that of the third embodiment in that a selection signal line is bent in the X direction.

Figure 30:
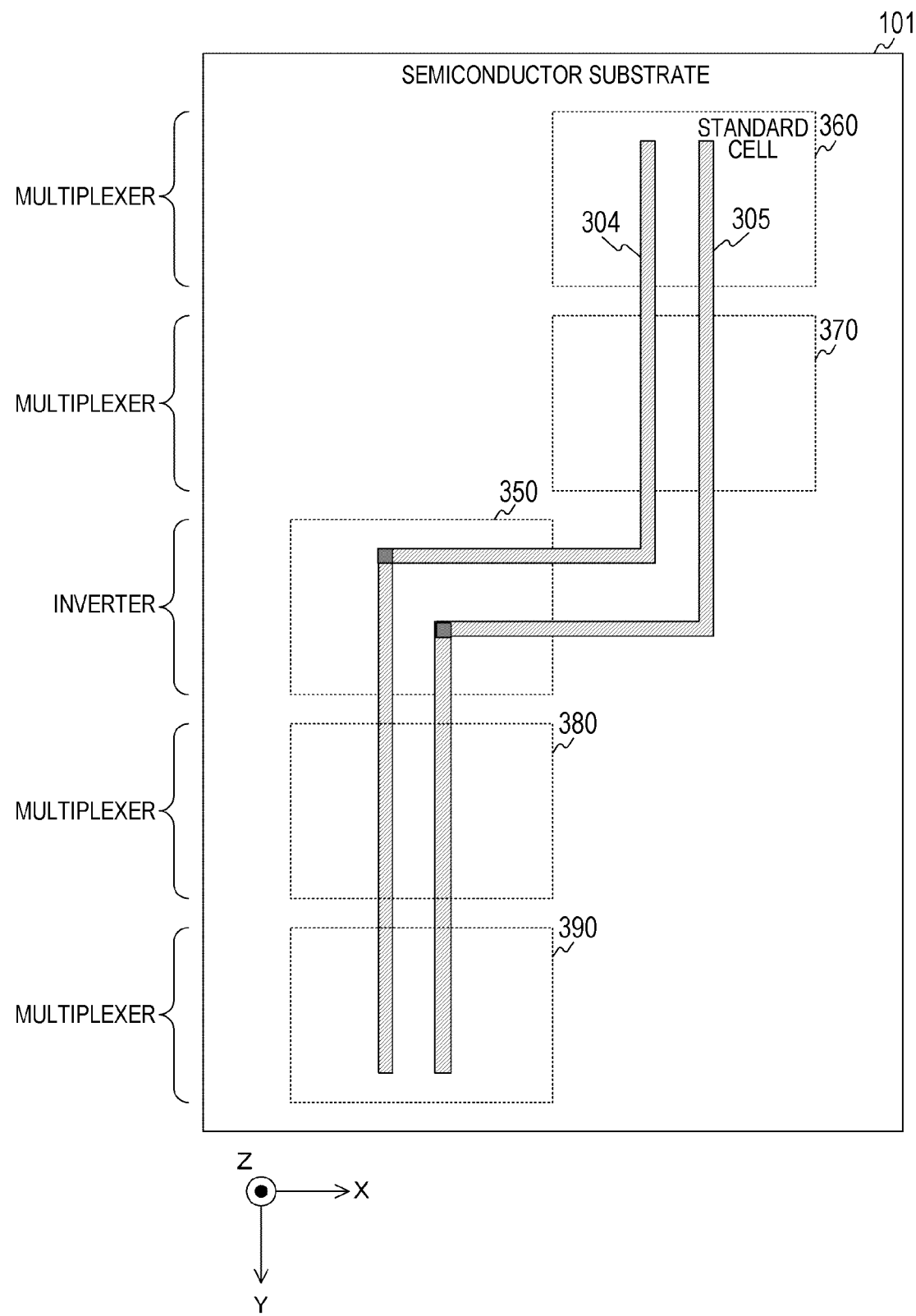
FIG. 30 is a plan view illustrating one example of a wiring layout of an inverter and multiplexers in a seventh embodiment of the present technology.

FIG. 30 is a plan view illustrating one example of a wiring layout of an inverter and multiplexers in the seventh embodiment of the present technology. In the seventh embodiment, a standard cell 350 is disposed on the third top. Standard cells 360 and 370 are disposed in a column different from a column in which the standard cell 350 is placed. In contrast, the standard cells 380 and 390 are arranged in the same column as a column in which the standard cell 350 is placed.

Selection signal lines 304 and 305 are wired in the Y direction in the standard cells 350, 380, and 390 in the same column. The standard cells 360 and 370 are, however, arranged in another column. The selection signal lines 304 and 305 are thus bent in the X direction at a part of, for example, a contact in the standard cell 350 provided with an inverter, and wired to a column in which the standard cells 360 and 370 are placed. Then, the selection signal lines 304 and 305 are bent in the Y direction, and wired to the standard cells 360 and 370.

Note that, even in a case where a master latch and a slave latch are not in the same column as the inverter, a clock signal line can be similarly bent and wired in the X direction in the inverter.

In this way, in the seventh embodiment of the present technology, the selection signal line linearly wired in the Y direction is bent and wired in the X direction in the standard cell 350, so that some multiplexers can be disposed in a column different from a column in which the inverter is placed. This can increase the degree of freedom in a circuit layout.

8. Eighth Embodiment

In the above-described first embodiment, the master latch and the slave latch are arranged in the Y direction. The layout, however, increases the size of the semiconductor integrated circuit 200 in the Y direction. An electronic device 100 of an eighth embodiment is different from that of the first embodiment in that a master latch and a slave latch are arranged in the X direction.

Figure 31:
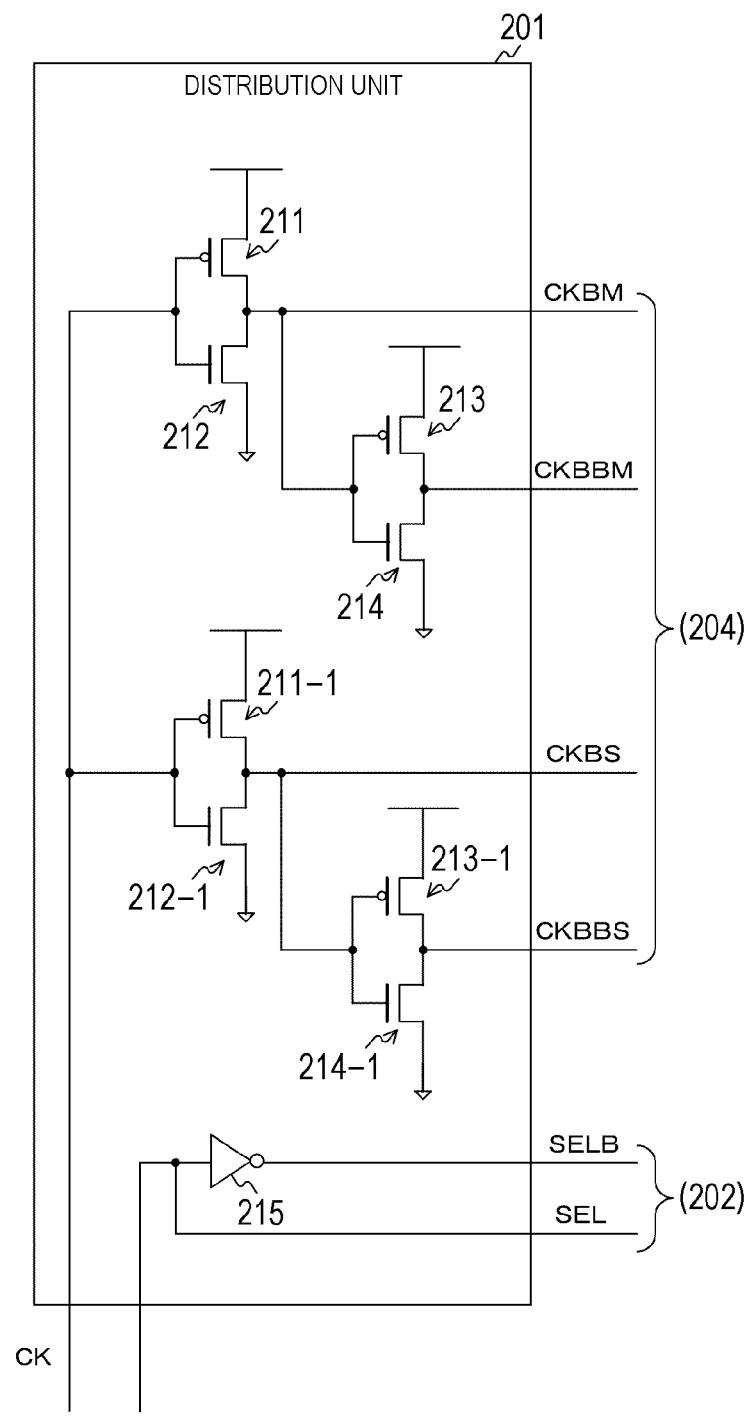
FIG. 31 is a circuit diagram illustrating one configuration example of a distribution unit in an eighth embodiment of the present technology.

FIG. 31 is a circuit diagram illustrating one configuration example of a distribution unit 201 in the eighth embodiment of the present technology. The distribution unit 201 in the eighth embodiment further includes P-type transistors 211-1 and 213-1 and N-type transistors 212-1 and 214-1. The connection configuration of the P-type transistors 211-1 and 213-1 and N-type transistors 212-1 and 214-1 is similar to that of the P-type transistors 211 and 213 and the N-type transistors 212 and 214. The P-type transistors 211-1 and 213-1 and the N-type transistors 212-1 and 214-1 are, for example, MOS transistors.

The inverter including the P-type transistor 211 and the N-type transistor 212 inverts the clock signal CK to generate a clock signal CKBM. The inverter including the P-type transistor 213 and the N-type transistor 214 inverts the clock signal CKBM to generate a clock signal CKBBM.

Furthermore, the inverter including the P-type transistor 211-1 and the N-type transistor 212-1 inverts the clock signal CK to generate a clock signal CKBS. The inverter including the P-type transistor 213-1 and the N-type transistor 214-1 inverts the clock signal CKBS to generate a clock signal CKBBS.

Figure 32:
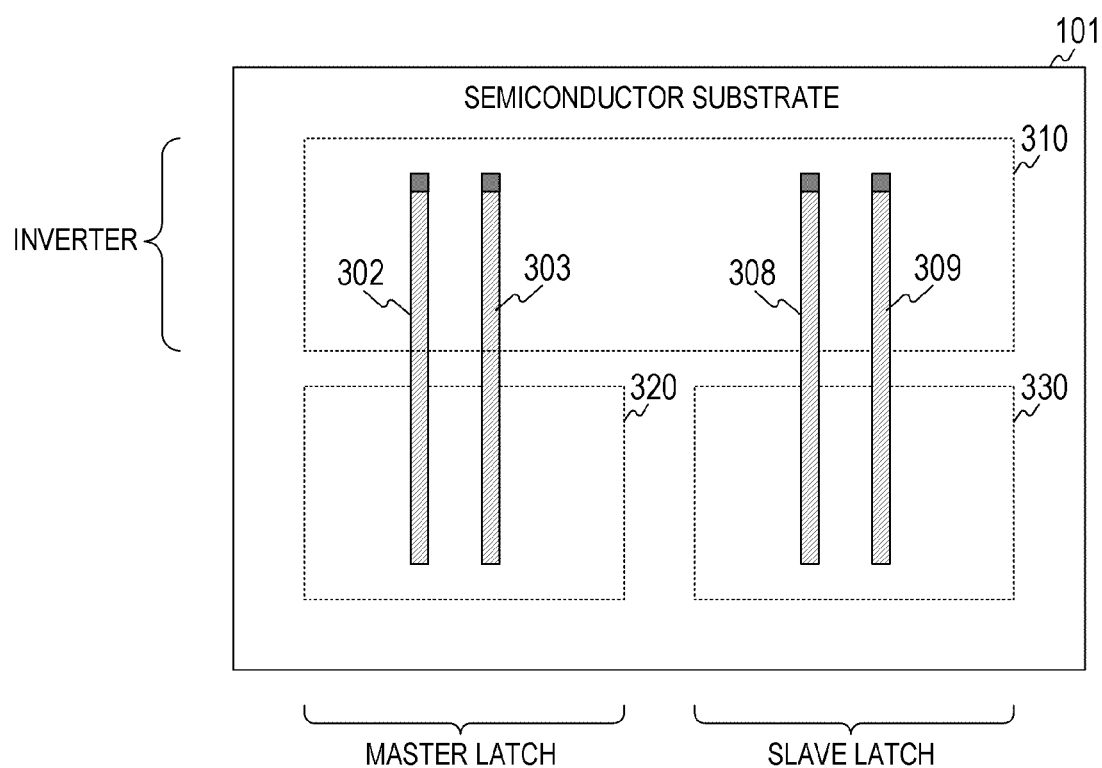
FIG. 32 is a plan view illustrating one example of a wiring layout of an inverter and a flip-flop in the eighth embodiment of the present technology.

FIG. 32 is a plan view illustrating one example of a wiring layout of an inverter and a flip-flop in the eighth embodiment of the present technology. A standard cell 320 in which a master latch is disposed and a standard cell 330 in which a slave latch is disposed are arranged in the X direction. Furthermore, a standard cell 310 and a standard cell 320 or 330 are arranged in the Y direction. Furthermore, clock signal lines 308 and 309 are further wired.

Clock signal lines 302 and 303 are wired in the Y direction in the standard cells 310 and 320. The clock signal lines 308 and 309 are wired in the Y direction in the standard cells 310 and 330. The standard cell 310 generates the clock signals CKBM and CKBBM from the clock signal CK, and outputs the generated signals to the master latch (standard cell 320) via the clock signals 302 and 303. Furthermore, the standard cell 310 generates the clock signals CKBS and CKBBS from the clock signal CK, and outputs the generated signals to the slave latch (standard cell 330) via the clock signals 308 and 309.

Note that the standard cell 310 may generate only the clock signal CKB without generating the clock signals CKBM and CKBS. The clock signal line 302 may be divided, and the generated clock signal CKB may be supplied not only to the master latch but to the slave latch. In the case, for example, the output of the inverter including the P-type transistor 211 and the N-type transistor 212 in FIG. 31 is required to be input to the P-type transistor 213, the N-type transistor 214, the P-type transistor 213-1, and the N-type transistor 214-1.

The standard cell 310 and the standard cell 320 or 330 arranged in the Y direction enables the clock signal lines 302, 303, 308, and 309 to be linearly wired in the Y direction.

Note that values of the threshold voltage, gate length, and gate width of a transistor in an inverter that generates the clock signals CKBM and CKBBM may be different from those of a transistor in an inverter that generates the clock signals CKBS and CKBBS. This enables speed-up of timing of data propagation to the slave side while setup time is secured by making the operation speed of the master latch slower than that of the slave latch, for example.

Furthermore, although one flip-flop including a master latch and a slave latch is disposed, two or more flip-flops can be disposed. In the case, for example, a standard cell provided with a second or subsequent master latch is required to be arranged in the Y direction below the standard cell 320, and a standard cell provided with a second or subsequent slave latch is required to be arranged in the Y direction below the standard cell 330. In this way, the number of bits to be held can be easily increased by extending a clock signal line in the Y direction and adding a standard cell.

In this way, in the eighth embodiment of the present technology, the standard cell 320 in which the master latch is disposed and the standard cell 330 in which the slave latch is disposed are arranged in the X direction, so that the size of the semiconductor integrated circuit 200 in the Y direction can be decreased.

9. Application Example

The technology according to the disclosure can be applied to a technology called "Internet of things (IoT)". IoT is a mechanism in which an IoT device 9100 that is a "thing" is connected to other IoT device 9003, the Internet, cloud 9005, and the like, and mutual control is performed by exchanging information. IoT can be used in various industries such as agriculture, home, automobile, manufacturing, distribution, and energy.

Figure 33:
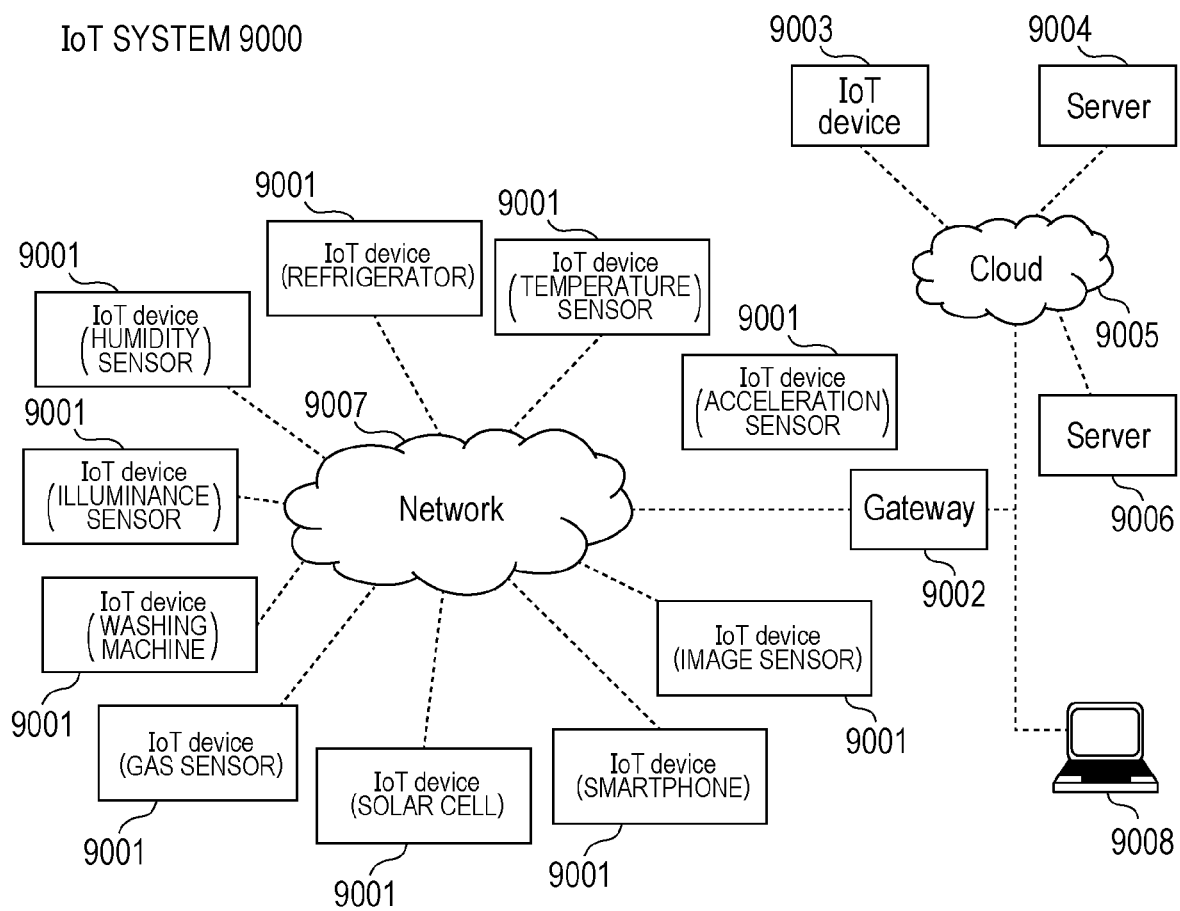
FIG. 33 illustrates one example of the schematic configuration of an IoT system 9000 to which the technology according to the disclosure can be applied.

FIG. 33 illustrates one example of the schematic configuration of an IoT system 9000 to which the technology according to the disclosure can be applied.

The IoT device 9001 includes, for example, various sensors such as a temperature sensor, a humidity sensor, an illuminance sensor, an acceleration sensor, a distance sensor, an image sensor, a gas sensor, and a human sensor. Furthermore, the IoT device 9001 may include a terminal such as a smartphone, a mobile phone, a wearable terminal, and a game device. The IoT device 9001 is powered by, for example, an AC power, a DC power, a battery, contactless power, and so-called energy harvesting. The IoT device 9001 can communicate by, for example, wired, wireless, or proximity wireless communication. A communication system such as 3G/LTE, WiFi, IEEE802.15.4, Bluetooth, Zigbee (registered trademark), and Z-Wave is preferably used. The IoT device 9001 may communicate by switching a plurality of these communication methods.

The IoT device 9001 may form a one-to-one, star, tree, or mesh network. The IoT device 9001 may be connected to the external cloud 9005 directly or through a gateway 9002. An address is given to the IoT device 9001 by, for example, IPv4, IPv6, or 6LoWPAN. Data collected from the IoT device 9001 is transmitted to, for example, other IoT devices 9003, a server 9004, and the cloud 9005. The timing and frequency of the IoT device 9001 transmitting data are preferably adjusted, and the data may be compressed and transmitted. Such data may be used as it is. A computer 9008 may analyze the data by various methods such as statistical analysis, machine learning, data mining, cluster analysis, discriminant analysis, combination analysis, and time series analysis. Using such data enables various services such as control, warning, monitoring, visualization, automation, and optimization.

The technology according to the disclosure can also be applied to devices and services related to homes. IoT device 9001 at home includes, for example, a washing machine, a drying machine, a dryer, a microwave oven, a dishwasher, a refrigerator, an oven, a rice cooker, a cooking utensil, a gas appliance, a fire alarm, a thermostat, an air conditioner, a television, a recorder, an audio, a lighting equipment, a water heater, a hot water heater, a vacuum cleaner, a fan, an air purifier, a security camera, a lock, a door/shutter opening/closing device, a sprinkler, a toilet, a thermometer, a scale, and a blood pressure monitor. The IoT device 9001 may further include a solar cell, a fuel cell, a storage battery, a gas meter, a power meter, and a distribution board.

The IoT device 9001 at home is preferably used in a communication system of a low power consumption type. Furthermore, the IoT device 9001 may communicate by WiFi indoors and by 3G/LTE outdoors. The IoT device 9001 may be controlled by providing an external server 9006 for controlling the IoT device on the cloud 9005. The IoT device 9001 transmits data on, for example, statuses of household devices, temperature, humidity, power usage, and presence/absence of a human/animal inside/outside a house. Data transmitted from a household device is accumulated in the external server 9006 through the cloud 9005. A new service is provided on the basis of such data. The above-described IoT device 9001 can be controlled by voice by using voice recognition technology.

Furthermore, the statuses of various household devices can be visualized by directly sending information from various household devices to a television. Moreover, powers of, for example, an air conditioner and a light can be turned off by various sensors determining presence/absence of a resident and sending data to the air conditioner and the light. Moreover, advertisements can be displayed on displays provided on various household devices through the Internet.

One example of the IoT system 9000, to which the technology according to the disclosure can be applied, has been described above. The technology according to the disclosure can be preferably applied to the IoT device 9001 among the configurations described above. Specifically, using the electronic device 100 illustrated in FIG. 1 as the IoT device 9001 can simplify the wiring shape of a signal line, and inhibit increases in parasitic capacitance and manufacturing variation.

Note that the above-described embodiments are examples for embodying the present technology, and the matter in the embodiments and the invention specifying matter in the claims have a corresponding relationship. Similarly, the invention specifying matter in the claims and the matter in the embodiments of the present technology having the same name as this matter have a corresponding relationship. Note, however that the present technology is not limited to the embodiments, and can be embodied by making various modifications to the embodiments without departing from the spirit thereof.

Note that the effects described herein is merely an illustration and not limited, and other effects may be exhibited.

Note that the present technology can also have the configurations as follows.

(1) A semiconductor integrated circuit including:
  an output circuit that outputs a predetermined differential signal from a positive output terminal and a negative output terminal;
  a logic circuit in which a plurality of positive transistors and a plurality of negative transistors are disposed, gates of the plurality of positive transistors being arranged in a predetermined direction, gates of the plurality of negative transistors being arranged in the predetermined direction;
  a positive signal line that is wired from the positive output terminal along the predetermined direction and that connects each of the gates of the plurality of positive transistors and the positive output terminal; and
  a negative signal line that is wired from the negative output terminal along the predetermined direction and that connects each of the gates of the plurality of negative transistors and the negative output terminal.

(2) The semiconductor integrated circuit according to (1),
  in which the differential signal includes a clock signal and a signal obtained by inverting the clock signal,
  the output circuit includes an inverter that inverts the clock signal, and
  the logic circuit includes:
  a master latch that holds and outputs data in synchronization with the differential signal; and
  a slave latch that holds the output data in synchronization with the differential signal.

(3) The semiconductor integrated circuit according to (2),
  in which the master latch and the slave latch are arranged in the predetermined direction.

(4) The semiconductor integrated circuit according to (2),
  in which the master latch and the slave latch are arranged in a direction perpendicular to the predetermined direction.

(5) The semiconductor integrated circuit according to (2) or (3),
  in which a power line and a ground line are wired along a direction perpendicular to the predetermined direction, and the power line and the ground line are alternately wired in the predetermined direction.

(6) The semiconductor integrated circuit according to any one of (1) to (5),
  in which the differential signal includes a selection signal and a signal obtained by inverting the selection signal,
  the output circuit includes an inverter that inverts the selection signal, and
  the logic circuit includes a multiplexer that selects one of a plurality of pieces of data in accordance with the differential signal.

(7) The semiconductor integrated circuit according to any one of (1) to (5),
  in which the differential signal includes a selection signal and a signal obtained by inverting the selection signal,
  the output circuit includes a first multiplexer that selects one of a plurality of pieces of data in accordance with the differential signal, and
  the logic circuit includes a second multiplexer that selects one of a plurality of pieces of data in accordance with the differential signal.

(8) The semiconductor integrated circuit according to any one of (1) to (7),
  in which the differential signal includes a first differential signal and a second differential signal,
  the logic circuit includes a first circuit and a second circuit arranged in the predetermined direction, and
  the output circuit includes:
  a first inverter that generates the first differential signal and outputs the generated first differential signal to the first circuit; and
  a second inverter that generates the second differential signal and outputs the generated second differential signal to the second circuit.

(9) The semiconductor integrated circuit according to any one of (1) to (8),
  in which the output circuit and the logic circuit have different sizes in the predetermined direction.

(10) The semiconductor integrated circuit according to any one of (1) to (9), in which the logic circuit includes a plurality of circuits arranged in a two-dimensional lattice pattern.
(11) The semiconductor integrated circuit according to any one of (1) to (10),
in which the positive signal line and the negative signal line are bent in a direction perpendicular to the predetermined direction in the output circuit.

REFERENCE SIGNS LIST

100 Electronic device
101 Semiconductor substrate
102 Transistor layer
103 Metal layer
200 Semiconductor integrated circuit
201 Distribution unit
202 Selection unit
203, 207, 208, 220 Multiplexer
204 Holding unit
205 Prestage flip-flop
206 Poststage flip-flop
211, 211-1, 213, 213-1, 221, 223, 225, 227, 251, 261, 263 P-type transistor
212, 212-2, 214, 214-1, 222, 224, 226, 228, 252, 262, 264 N-type transistor
215, 216, 229, 254, 265, 266, 267 Inverter
250 Master latch
253 Clocked inverter
260 Slave latch
301, 302, 303, 308, 309 Clock signal line
304, 305, 306, 307 Selection signal line
310, 320, 330, 350, 360, 370, 380, 390, 400, 410, 420, 430, 440, 450, 460, 470, 480, 490 Standard cell
311, 322, 331, 351, 362, 371 P layer
312, 321, 332, 352, 361, 372 N layer
341, 343 Power line
342, 344 Ground line
401, 402 Data line
501, 502 Output terminal
511, 521 Output line
512, 514, 522, 524 Gate electrode
513, 515, 523, 525 Inter-gate wiring
9001 IoT device

The invention claimed is:

1. A semiconductor integrated circuit comprising:
an output circuit configured to output a predetermined differential signal from a positive output terminal and a negative output terminal;
a first logic circuit including a first plurality of PMOS transistors and a first plurality of NMOS transistors, respective gates of the first plurality of PMOS transistors being arranged in a predetermined direction, respective gates of the first plurality of NMOS transistors being arranged in the predetermined direction;
a second logic circuit including a second plurality of PMOS transistors and a second plurality of NMOS transistors, respective gates of the second plurality of PMOS transistors being arranged in the predetermined direction and respective gates of the second plurality of NMOS transistors being arranged in the predetermined direction;
a positive signal line wired along the predetermined direction from the positive output terminal and connecting the respective gates of each of the first and second plurality of PMOS transistors to the positive output terminal; and
a negative signal line wired along the predetermined direction from the negative output terminal and connecting the respective gates of each of the first and second plurality of NMOS transistors to the negative output terminal, wherein
the output circuit, the first logic circuit, and the second logic circuit are respectively arranged in a first row, a second row and a third row of a gate wiring layer, the second row being adjacent to the first row, and the third row being adjacent to the second row,
the positive signal line and the negative signal line are gate layer wiring including segments extending linearly across and intersecting with all of the first row, the second row, and the third row of the gate wiring layer,
the output circuit includes an inverter circuit including a third PMOS transistor and a third NMOS transistor, and
the positive signal line is connected to the respective gates of the third PMOS transistor and the third NMOS transistor of the inverter circuit,
wherein, in the first logic circuit, an output data line has a first branch extending in the predetermined direction to be connected to a first PMOS transistor included in the first plurality of PMOS transistors and a second branch extending in a direction perpendicular to the predetermined direction to be connected to a first NMOS transistor included in the first plurality of NMOS transistors, and
the second branch of the output data line is wired around a portion of the positive signal line and a portion of the negative signal line such that the output data line is not linearly wired in the first logic circuit.

2. The semiconductor integrated circuit according to claim 1,
wherein the predetermined differential signal includes a clock signal and a signal obtained by inverting the clock signal, and
the first logic circuit includes a master latch that holds and outputs data on the output data line in synchronization with the predetermined differential signal, and
the second logic circuit includes a slave latch that holds the output data in synchronization with the predetermined differential signal.

3. The semiconductor integrated circuit according to claim 2,
wherein the master latch and the slave latch are arranged in the predetermined direction.

4. The semiconductor integrated circuit according to claim 2,
wherein the master latch and the slave latch are arranged in a direction perpendicular to the predetermined direction.

5. The semiconductor integrated circuit according to claim 2,
wherein a power line and a ground line are wired along a direction perpendicular to the predetermined direction, and
the power line and the ground line are alternately wired in the predetermined direction.

6. The semiconductor integrated circuit according to claim 1,
wherein the predetermined differential signal includes a selection signal and a signal obtained by inverting the selection signal, and
the output circuit includes an inverter that inverts the selection signal.

7. The semiconductor integrated circuit according to claim 1, wherein the predetermined differential signal includes a selection signal and a signal obtained by inverting the selection signal.

8. The semiconductor integrated circuit according to claim 1,
wherein the predetermined differential signal includes a first differential signal and a second differential signal, and
the output circuit includes:
a first inverter that generates the first differential signal and outputs the generated first differential signal to the first logic circuit; and
a second inverter that generates the second differential signal and outputs the generated second differential signal to the second logic circuit.

9. The semiconductor integrated circuit according to claim 1,
wherein the output circuit and the logic circuit have different sizes in the predetermined direction.

10. The semiconductor integrated circuit according to claim 1
wherein the logic circuit includes a plurality of circuits arranged in a two-dimensional lattice pattern.

11. The semiconductor integrated circuit according to claim 1,
wherein the positive signal line and the negative signal line are bent in a direction perpendicular to the predetermined direction in the output circuit.

* * * * *